(12) United States Patent
Casarsa

(10) Patent No.: US 8,996,939 B2
(45) Date of Patent: Mar. 31, 2015

(54) SYSTEM FOR PERFORMING THE TEST OF DIGITAL CIRCUITS

(75) Inventor: Marco Casarsa, Vaprio D'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 244 days.

(21) Appl. No.: 13/090,171

(22) Filed: Apr. 19, 2011

(65) Prior Publication Data

US 2011/0258499 A1 Oct. 20, 2011

(30) Foreign Application Priority Data

Apr. 20, 2010 (IT) .............................. MI2010A0674

(51) Int. Cl.
  *G01R 31/28* (2006.01)
  *G01R 31/317* (2006.01)
  *G01R 31/3185* (2006.01)

(52) U.S. Cl.
  CPC .... *G01R 31/31724* (2013.01); *G01R 31/31701* (2013.01); *G01R 31/318555* (2013.01)
  USPC .......................................... 714/726; 714/733

(58) Field of Classification Search
  None
  See application file for complete search history.

(56) References Cited

U.S. PATENT DOCUMENTS

| | | | |
|---|---|---|---|
| 6,272,653 B1 * | 8/2001 | Amstutz | 714/724 |
| 6,530,050 B1 | 3/2003 | Mergard | |
| 6,751,764 B1 | 6/2004 | Golshan et al. | |
| 7,010,782 B2 * | 3/2006 | Narayan et al. | 717/124 |
| 7,313,739 B2 | 12/2007 | Menon et al. | |
| 7,607,060 B2 | 10/2009 | Gorman et al. | |
| 8,312,332 B2 * | 11/2012 | Leininger et al. | 714/732 |
| 8,365,029 B2 * | 1/2013 | von Wendorff | 714/726 |
| 8,484,523 B2 * | 7/2013 | Ramaraju et al. | 714/731 |
| 2004/0128596 A1 * | 7/2004 | Menon et al. | 714/724 |
| 2004/0230879 A1 * | 11/2004 | Crosby | 714/718 |
| 2007/0011535 A1 * | 1/2007 | Anzou et al. | 714/733 |
| 2007/0113124 A1 * | 5/2007 | Chang et al. | 714/724 |
| 2008/0052573 A1 * | 2/2008 | Pekny | 714/724 |
| 2008/0082883 A1 * | 4/2008 | Gorman et al. | 714/733 |

OTHER PUBLICATIONS

Lee, K.-J. et al., "A Low-Cost SOC Debug Platform Based on On-Chip Test Architectures," 2009 IEEE International SOC Conference, pp. 161-164, Sep. 9-11, 2009.

Zhuang, F. et al., "System level LBIST implementation," 17th Asian Test Symposium (ATS '08), p. 263, Nov. 24-27, 2008.

* cited by examiner

*Primary Examiner* — Daniel McMahon

(74) *Attorney, Agent, or Firm* — Seed IP Law Group PLLC

(57) ABSTRACT

A system includes a controller configured for executing the test of the digital circuit, a memory configured for storing a status of the digital circuit, and a state machine configured for controlling, before the execution of the test, the storage into the memory of the status of the digital circuit and configured for controlling, after the execution of the test, restoring the status of the digital circuit based on the status stored in the memory.

30 Claims, 4 Drawing Sheets

SYSTEM FOR PERFORMING THE TEST OF DIGITAL CIRCUITS

BACKGROUND

1. Technical Field

The present disclosure generally relates to the field of the test of integrated circuits. More specifically, the present disclosure concerns the test of digital circuits of an integrated circuit executed during the operation of the integrated circuit itself.

2. Description of the Related Art

It is known to perform the test of integrated circuits, for verifying the correct operation. In fact, it is possible that the operation of an integrated circuit is not the correct one (for example, as defined by the technical specifications) due to faults in the integrated circuit, such as for example faults caused by the process of manufacturing the integrated circuit.

A known technique is to perform the test of an integrated circuit at the end of the manufacturing process, for example by means of the generation of a sequence at the input of the integrated circuit and by means of verify the outputs of the integrated circuit, using a dedicated machine external to the integrated circuit.

Another known technique is to perform the test of the integrated circuit when the device is supplied: for example, in case wherein the integrated circuit is mounted on a car the test is performed when the car is started, in case the integrated circuit is mounted on a computer the test is performed when the computer is turned on. In this known technique specific circuits placed inside the integrated circuit are used for generating stimulus signals at the input of the integrated circuit and such to verify the response of the integrated circuit to said stimulus signals.

BRIEF SUMMARY

The Applicant has observed that a disadvantage of the known techniques is of not allowing to detect some faults, such as for example faults occurring during the operation of the integrated circuit.

One embodiment of the present disclosure relates to a system for performing the test of a digital circuit. The system includes a controller configured to execute the test of the digital circuit; a memory configured to store a status of the digital circuit; and a state machine. The state machine is configured to control storing into the memory of the status of the digital circuit before the test is executed and control restoring the status into the digital circuit after the test is executed.

The Applicant has recognized that the test system according to the present disclosure can detect faults of portions of an integrated circuit occurring during its operation such as for example faults caused by the aging of the integrated circuit, without losing the status of the integrated circuit and in a transparent way for the user.

One embodiment of the present disclosure is an integrated circuit that includes the digital circuit, the system, and an application module configured for generating a signal for activating the test of the digital circuit.

One embodiment of the present disclosure is a method for performing the test of a digital circuit. The method includes generating at least one signal for controlling storing into a memory of a status of the digital circuit; storing the status of the digital circuit into the memory; executing the test of the digital circuit after storing the status of the digital circuit into the memory; generating at least one signal for controlling restoring into the digital circuit of the status stored into the memory; and, executing the test of the digital circuit, restoring into the digital circuit the status stored into the memory.

One embodiment of the present disclosure is a non-transitory computer-readable medium storing contents configured to implement the method.

BRIEF DESCRIPTION OF THE SEVERAL VIEWS OF THE DRAWINGS

Further characteristics and advantages of the disclosure will be understood from the following description of a preferred embodiment and of its variants provided as an example with reference to the enclosed drawings, wherein.

DETAILED DESCRIPTION

Figure 1:
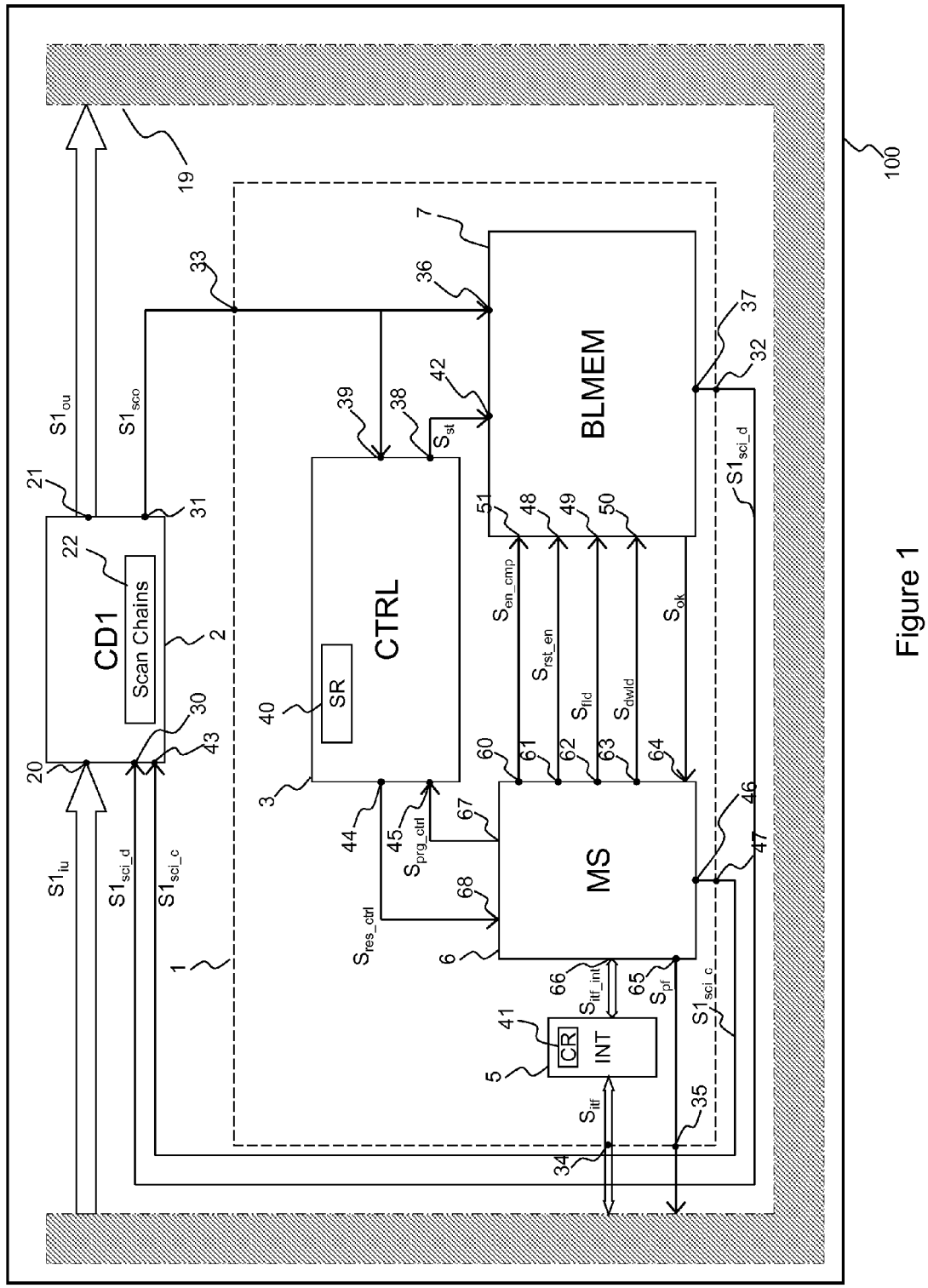
FIG. 1 schematically shows an integrated circuit comprising a system for performing the test of a digital circuit according to a first embodiment of the disclosure.

Referring to FIG. 1, it is shown an integrated circuit 100 according to a first embodiment of the disclosure comprising a digital circuit 2, an application module 19 and a system 1 for performing the test of the digital circuit 2 (called in the following "test system 1"). The integrated circuit 100 can be a specific or programmable integrated circuit (for example, a FPGA=Field Programmable Gate Array) and it can be mounted on a vehicle with it, such as for example a car or motorcycle.

The digital circuit 2 and the test system 1 are such to operate according to two operation modes:

a normal operation mode, wherein the digital circuit 2 is such to operate normally and wherein the test system 1 is in a stand-by condition;
 a test operation mode, wherein the test system 1 is in a test condition for performing the test of the digital circuit 2.

Specifically, the test operation mode comprises the following phases:

a configuration phase, wherein the parameters used by the test system 1 for performing the test of the digital circuit 2 are read;
 a phase of status storage, wherein the status of the digital circuit 2 before the test execution is stored into a memory;
 an execution phase, wherein the test system 1 is executing the test of the digital circuit 2 for verifying if there are faults in the digital circuit 2;
 a phase of status loading, wherein it is restored into the digital circuit 2 the status of the digital circuit 2 previously stored into the memory;
 a phase of result check, wherein the result of the test of the digital circuit 2 is verified.

The digital circuit 2 implements a combinatorial and sequential logic function and comprises:

a plurality of input user terminals 20 for receiving from the application module 19 a plurality of input user signals $S1_{iu}$;

a plurality of output user terminals 21 for generating a plurality of output user signals $S1_{ou}$;

at least one input test data terminal 30 for receiving from the test system 1 at least one input test data signal $S1_{sci\_d}$;

at least one input control test terminal 43 for receiving from the test system 1 at least one input test control signal $S1_{sci\_c}$;

at least one output test terminal 31 for generating at least one output test signal $S1_{sco}$.

The application module 19 has the function of running one or more user applications by means of the digital circuit 2.

The application module 19 includes circuits for managing the supply (for example, voltage regulators), analog circuits (for example, analog/digital and digital/analog converters), one or more processors for running said applications, one or more memories (for example, Flash and RAM), time and clock signals sources (for example, oscillators and PLL), peripherals and interfaces towards the external of the integrated circuit 100 (for example, interfaces of Ethernet or USB type). More in general, the application module 19 includes the circuits on which it is not performed the test of the operation.

Specifically, the application module 19 is configured to generate the plurality of input user signals $S1_{iu}$ and is configured to receive from the digital circuit 2 the plurality of output user signals $S1_{ou}$. Moreover, the application module 19 is configured to receive from the test system 1 a test result signal $S_{pf}$ and is configured to generate/receive input/output interface signals $S_{itf}$ (for simplicity in FIG. 1 the input/output interface signals of the application module 19 are shown with only one double-sided arrow and are always indicated with $S_{itf}$).

The test system 1 has the function of performing the test of the digital circuit 2, that is to verify if the operation of the digital circuit 2 is correct or if there is at least one fault in the digital circuit 2. In the present description the term "fault" of the digital circuit 2 can be generally interpreted as identifying a condition of the digital circuit 2 wherein it does not operate correctly: this comprises both the condition of a serious fault wherein for example the digital circuit 2 is no more correctly supplied, and other conditions of fault wherein the digital circuit 2 is supplied but it does not operate correctly because it does not fulfill the technical specifications.

The test system 1 comprises:

at least one output data terminal 32 for generating the at least one input test data signal $S1_{sci\_d}$;

at least one output control terminal 47 for generating the at least one input test control signal $S1_{sci\_c}$;

at least one input data terminal 33 for receiving from the digital circuit 2 the at least one output test signal $S1_{sco}$;

an output terminal 35 for generating the test result signal $S_{pf}$;

at least one input/output terminal 34 for receiving/transmitting the input/output interface signals $S_{itf}$.

The test system 1 comprises a controller 3, a memory module 7, a state machine 6 and an interface module 5.

The controller 3 has the function of generating the stimuli for performing the test of the digital circuit 2, as it will be explained more in detail afterwards. The controller 3 comprises:

at least one output terminal 38 for transmitting to the memory module 7 at least one test pattern sequence signal $S_{st}$;

at least one input terminal 39 (connected to the at least one input data terminal 33) for receiving and output test signal $S1_{sco}$ from the digital circuit 2;

at least one output terminal 44 for transmitting to the state machine 6 one or more results and control signals $S_{res\_ctrl}$ indicating the phases of operation of the controller 3 and indicating the values obtained from the controller 3 at the end of the test operation mode (among them the value of a scan test signature), as it will be explained more in detail afterwards;

at least one input terminal 45 for receiving from the state machine 6 one or more control and programming signals $S_{prg\_ctrl}$ carrying the parameters for executing the test operation mode and carrying information for the synchronization between the state machine 6 and the controller 3, as it will be explained more in detail afterwards.

The memory module 7 comprises a memory 14 (FIG. 2) having the function of storing the status of the digital circuit 2 at a time instant before the execution of the test: this allows not losing—during the test operation mode—the status that the digital circuit 2 had before the activation of the test operation mode.

Preferably, the status of the digital circuit 2 is the value stored (at a time instant before the execution of the test) of the sequential elements included into the digital circuit 2 (for example, the value of registers or flip-flops used for implementing the logic function of the digital circuit 2).

The memory module 7 comprises:

at least one first input terminal 36 (connected to the at least one input data terminal 33) such to receive from the digital circuit 2 the status of the digital circuit 2 by means of the at least one output test signal $S1_{sco}$ when the digital circuit 2 is such to operate in the status storage phase of the test operation mode;

at least one second input terminal 42 (connected to the at least one output terminal 38 of the controller 3) for receiving from the controller 3 the at least one test pattern sequence signal $S_{st}$;

at least one output terminal 37 (coincident with the at least one output data terminal 32 of the test system 1) for generating the at least one test pattern sequence signal $S_{st}$ or for generating the status of the digital circuit 2 read from a memory in the memory module 7 and for transmitting them to the digital circuit 2 by means of the at least one input data test signal $S1_{sci\_d}$;

a third input terminal 48 for receiving from the state machine 6 a initialization signal $S_{rst\_en}$;

a fourth input terminal 49 for receiving from the state machine 6 a write increase signal $S_{fld}$; and a fifth input terminal 50 for receiving from the state machine 6 a read increase signal $S_{dwld}$.

The state machine 6 has the function of controlling the execution of the test of the digital circuit 2, in particular of controlling the storage of the status of the digital circuit 2 into the memory 14 and of controlling the read from the memory 14 of the stored status of the digital circuit 2. The state machine 6 comprises:

at least one input terminal 68 (connected to the at least one output terminal 44 of the controller 3) for receiving from the controller 3 the at least one result and control signal $S_{res\_ctrl}$;

an output terminal 61 for generating the initialization signal $S_{rst\_en}$;

an output terminal 62 for generating the write increase signal $S_{fld}$, which has the function of increasing the value of a counter during the writing into the memory 14 in the memory module 7, as it will be explained more in detail afterwards;

an output terminal 63 for generating the read increase signal $S_{dwld}$, which has the function of increasing the value of the counter during the reading from the memory 14, as it will be explained more in detail afterwards;

an output terminal 65 for generating the test result signal $S_{pf}$ which has the function of indicating if the test of the digital circuit 2 was successful;

at least one input/output terminal 66 for receiving from the interface module 5 output internal interface signals $S_{itf\_int}$ and for generating input internal interface signals $S_{itf\_int}$;

at least one output terminal 67 (connected to the at least one input terminal 45 of the controller 3) for transmitting to the controller 3 the at least one programming and control signal $S_{prg\_ctrl}$;

at least one output terminal 46 (coincident with the output control terminal 47 of the test system 1) for generating the at least one input test control signal $S1_{sci\_c}$.

The state machine 6 implements a sequential and combinatorial logic function, wherein the sequential logic function defines the current and next state of the state machine 6. The state machine 6 comprises one or more inputs and one or more outputs, wherein the outputs of the state machine 6 are calculated as a function of the inputs and of the current state of the state machine 6. The state machine 6 can be implemented on an integrated circuit specific for the application or by means of a programmable circuit.

The interface module 5 has the function of storing the execution parameters for executing the test of the digital circuit 2.

The interface module 5 comprises at least one input terminal for receiving from the application module 19 the input interface signals $S_{itf}$, comprises at least one output terminal for generating the output interface signals $S_{itf}$ (for the sake of simplicity in FIG. 1 the input/output terminals towards the application module 19 are shown as only one double-sided arrow and are always indicated with $S_{itf}$) and comprises at least one input/output terminal for receiving/transmitting from the state machine 6 the input internal interface signals $S_{itf\_int}$ (for the sake of simplicity in FIG. 1 the input/output terminals towards the state machine 6 are indicated by only one double-sided arrow).

Moreover, the interface module 5 comprises configuration registers 41 having the function of storing the execution parameters for executing the test of the digital circuit 2, as it will be explained more in detail afterwards.

Figure 2:
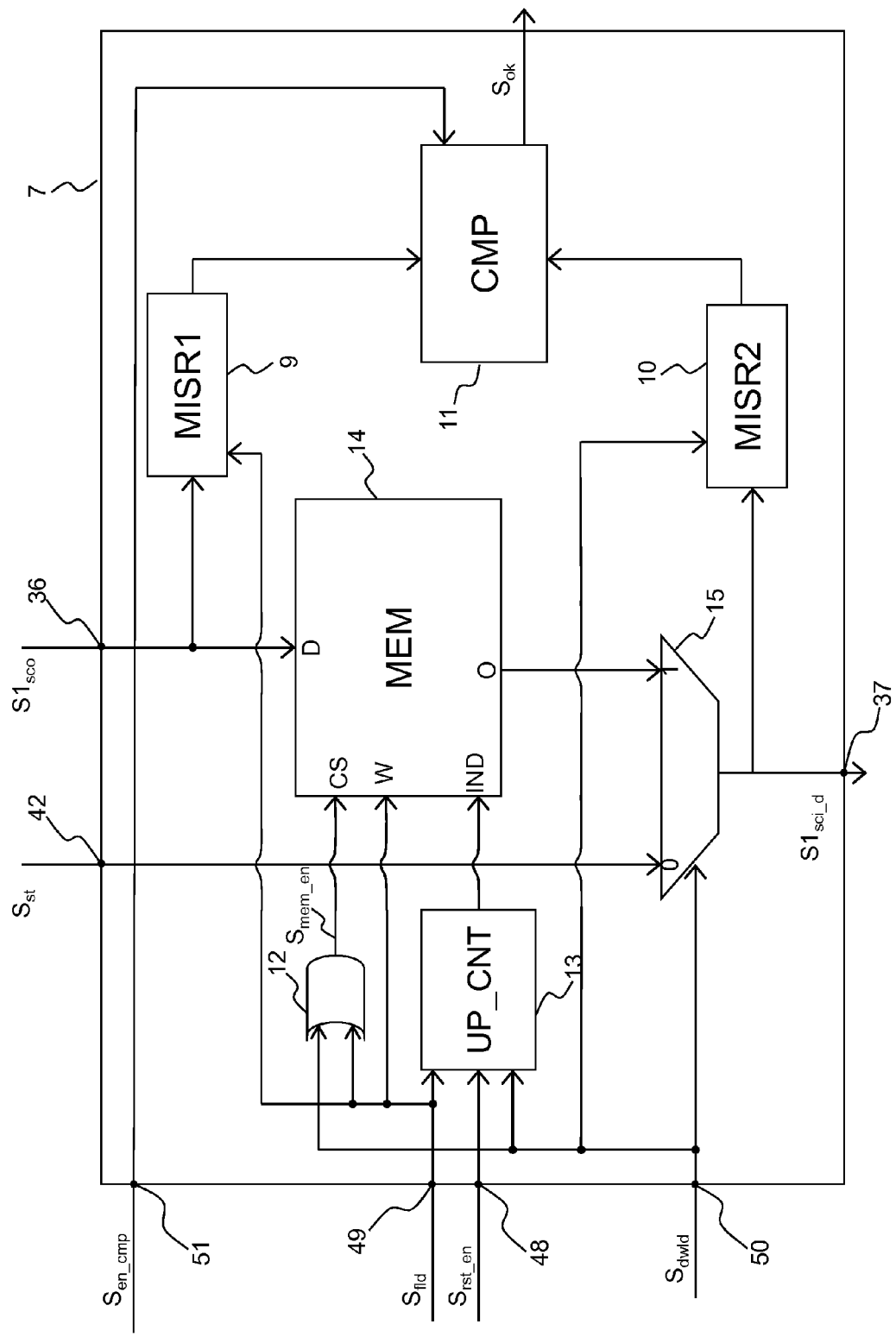
FIG. 2 shows more in detail a possible embodiment of the memory module used in the system according to the first embodiment of the disclosure.

Referring to FIG. 2, it is shown more in detail a possible embodiment of the memory module 7 used in the test system 1 according to the first embodiment of the disclosure.

In such embodiment the at least one output test terminal 31 of the digital circuit 2 (which is connected to the at least one input terminal 36 of the memory module 7) is a N-size bus consisting of a plurality N of output test terminals 31 and the at least one input data terminal D of the memory 14 is a bus having the same size N, that is the two buses carry the same plurality N of output test signals $S1_{sco}$; moreover, the at least one second input terminal 42 is also a N-size bus such to generate a plurality N of test pattern sequence signals $S_{st}$.

The memory module 7 comprises the memory 14 having the function of storing the status of the digital circuit 2 at a time instant before the test execution.

Specifically, the memory 14 comprises:

at least one input data terminal D (connected to the input terminal 36 of the memory module 7) such to receive from the digital circuit 2 the data to be written into the memory 14, wherein said data are carried by the plurality N of output test signals $S1_{sco}$;

at least one output data terminal O for generating the data read from the memory 14, wherein said data are carried over a plurality N of signals indicating the status of the digital circuit 2 stored at a time instant before the test execution;

an address bus terminal IND for receiving the read or write addresses from the memory 14;

an enable terminal CS for enabling the access to the memory 14;

a write enable terminal W for enabling the write operation into the memory 14.

It is supposed that the operation of the integrated circuit 100 is synchronous according to a clock signal (for the sake of simplicity, in the figures the clock signal has not been shown).

In the embodiment of the memory module 7 shown in FIG. 2, the output test terminal 31 of the digital circuit 2 (which is connected to the input terminal 36 of the memory module 7) and the input data terminal D of the memory 14 are a parallel bus having the same size N: in this case a plurality of output test terminals 31 is directly connected to a plurality of input data terminals D of the memory 14. Analogously, the input test data terminal 30 of the digital circuit 2 (which is connected to the output terminal of the memory module 7) and the output data terminal O of the memory 7 are a parallel bus having the same size N.

The memory module 7 further comprises:

a multiplexer 15 having a first input bus connected to a second input bus 42 of the memory module 7 and such to receive from the controller 3 a plurality N of test pattern sequence signals $S_{st}$, having a second input bus connected to the output data bus O of the memory 14 and such to receive the data read from the memory 14, having an input selection terminal for receiving from the state machine 6 the read increase signal $S_{dwld}$ and having an output bus (connected to the output bus 37 of the memory module 7 and thus connected to the output data bus 32 of the test system 1) for transmitting to the digital circuit 2 the plurality N of the test pattern sequence signals $S_{st}$ or the data read from the memory 14 by means of the output data bus O, as a function of the value of the read increase signal $S_{dwld}$ received at the input selection terminal (it is supposed that the output terminal is such to transmit the plurality N of the test pattern sequence signals $S_{st}$ in case the read increase signal $S_{dwld}$ has a low logic value and is such to transmit the data read from the memory 14 in case the read increase signal $S_{dwld}$ has a high logic value, as schematically shown in FIG. 2);

a counter 13 having the function of scanning the memory 14, said counter 13 having a first input terminal for receiving from the state machine 6 the initialization signal $S_{rst\_en}$ having the function of resetting the value of the counter 13, a second input terminal for receiving from the state machine 6 the write increase signal $S_{fld}$ having the function of increasing the value of the counter 13 during the write into the memory 14, a third input terminal for receiving from the state machine 6 the read increase signal $S_{dwld}$ having the function of increasing the value of the counter 13 during the read from the memory 14 and an output bus (connected to the address bus of the memory 14) for generating a count signal equal to the value of the counter;

an OR type logic cell 12 having a first input terminal for receiving from the state machine 6 the write increase signal $S_{fld}$, having a second input terminal for receiving from the state machine 6 the read increase signal $S_{dwld}$ and having an output terminal (connected to the enable terminal CS of the memory 14) for generating a first memory enable signal $S_{mem\_en}$ having the function of enabling the access to the memory 14, wherein the first memory enable signal $S_{mem\_en}$ is equal to the OR logic of the write increase signal $S_{fld}$ with the read increase signal $S_{dwld}$.

Figure 3:
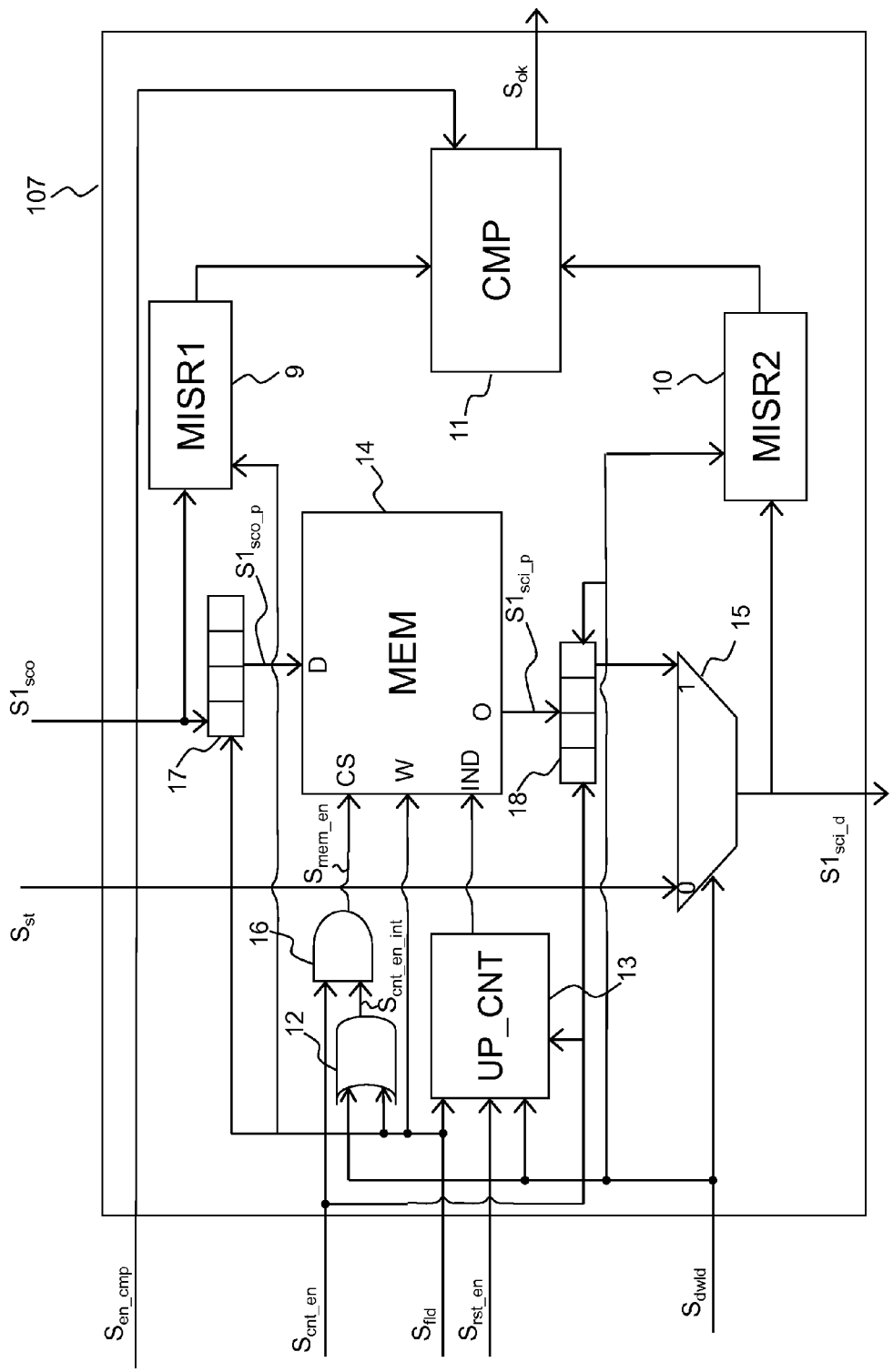
FIG. 3 shows more in detail a further possible embodiment of the memory module used in the system according to the first embodiment of the disclosure.

Referring to FIG. 3, it is shown in more detail a further possible embodiment of the memory module 7 used in the test system 1 according to the first embodiment of the disclosure.

It has to be noted that identical or similar blocks and signals have been indicated in FIGS. 2 and 3 with the same numerical references.

In the embodiment shown in FIG. 3 the output test terminal 31 of the digital circuit 2 is a single terminal, while the input data terminal D of the memory 14 is a parallel bus of size N; analogously, the output data terminal O of the memory 14 is a parallel bus of size N, while the input test data terminal 30 of the digital module 2 is a single terminal. In this case the output test terminal 31 is connected to the input data terminal D by means of a serial/parallel converter 17; analogously, the output data terminal O of the memory 14 is connected to the second input terminal of the multiplexer 15 by means of a parallel/serial converter 18.

The embodiment of the memory module 7 of FIG. 3 differs from the embodiment of the memory module 7 of FIG. 2 in that the following further components are present:

a serial/parallel converter 17 (implemented for example with a shift register) such to receive the output test signal $S1_{sco}$ having a serial format, such to receive the write increase signal $S_{fld}$ and such to generate a parallel output test signal $S1_{sco\_p}$ obtained by means of the serial to parallel conversion of the output test signal $S1_{sco}$;

a parallel/serial converter 18 (implemented for example with a shift register) such to receive from the output data terminal O a parallel input test signal $S1_{sci\_p}$ carrying the data read from the memory 14 in parallel format, such to receive from the state machine 6 a second memory enable signal $S_{cnt\_en}$ and the read increase signal $S_{dwld}$ and such to generate the signal at the second input terminal of the multiplexer 15 in a serial format by means of the parallel to serial conversion of the signal $S1_{sci\_p}$ at the output data terminal O;

an AND type logic cell 16 having two inputs and one output.

Moreover, the state machine 6 is such to further generate the second memory enable signal $S_{cnt\_en}$ (not shown in FIG. 1) for enabling the access to the memory 14 and for controlling the shift of the shift register 18 or the sampling of the data read from the memory 14, the logic cell 16 is such to receive from the state machine 6 the second memory enable signal $S_{cnt\_en}$, is such to receive an internal memory enable signal $S_{cnt\_en\_int}$ from the output of the OR type logic cell 12, and is such to generate the first memory enable signal $S_{mem\_en}$ equal to the AND logic between the second memory enable signal $S_{cnt\_en}$ and the internal memory enable signal $S_{cnt\_en\_int}$.

Advantageously, the test system 1 is such to perform the test of the digital circuit 2 by means of a circuit (implemented with the controller 3) inside the integrated circuit 100 such to autonomously generate the at least one test pattern sequence signal $S_{st}$ and by means of one or more scan chains 220 configured inside the digital circuit 2, that is a number N (N being greater than or equal to 1) of scan chains 220 is configured between the at least one input test data terminal 30 and the at least one output test terminal 31 of the digital circuit 2 (as it will be explained more in detail afterwards: this type of test is commonly indicated as Logic Built-In Self Test (shortly with LBIST). In this case, in the test operation mode the digital circuit 2 is configured such that to switch between a condition of shift register and a condition of normal operation, by means of suitable control signals and of the clock signal (as it will be explained more in detail afterwards). More specifically:

in the shift register condition, one or more scan chains 22 are configured (also of different length) inside the digital circuit 2, wherein each scan chain 22 is composed of a chain of one or more flip-flops and is functionally equivalent to a shift register having a size equal to the number of flip-flops of the chain, wherein said flip-flops are the same which are used (when the digital circuit 2 is in the normal operation mode) for implementing a generic logic function in the digital circuit 2;

in the normal operation condition (that in this context is also known as "capture" condition) the digital circuit 2 is such to operate as in the normal operation mode, wherein it implements the generic logic function in the digital circuit 2: in this way it is calculated the next state of the digital circuit 2 as a function of the current state (loaded in the previous shift register condition) and of the inputs and this allows to perform the test also of the combinatorial logic function of the digital circuit 2.

In this case in the embodiment of FIG. 2, memory module 7 has a number N of input test data terminals 30 equal to the number of scan chains and greater or equal to 1 and has a number N of output test terminals 31 equal to the number of scan chains and greater or equal to 1. When the integrated circuit is in the status storage phase of the test operation mode, the memory 14 is configured to receive from the digital circuit 2 the status of the digital circuit 2 from the N scan chains by means of N output test signals $S1_{sco}$; when on the contrary the integrated circuit is in the status loading phase of the test operation mode, the memory 14 is configured to transmit to the digital circuit 2 the status stored into the memory 14 by means of the N input test data signals $S1_{sci\_d}$.

In the hypothesis wherein the test of the digital circuit 2 is performed using the one or more scan chains 22, when the controller 3 is in the execution phase of the test operation mode, the controller 3 is configured to receive at the input terminal 39 the data generated by the digital circuit 2 by means of the at least one output test signal $S1_{sco}$ and, as a function of these data, is configured to calculate the value of a scan test signature (for example, it is a digital signature, such as a cyclic redundancy code) and store it into a shift register 40 inside the controller 3, wherein the scan test signature has a minimum size (for example, 16 bits, typically 32 bits) for reducing to a minimum the error masking probability (indicated as "aliasing") also in the case wherein the number N of the scan chains is low. Moreover, the application module 19 is such to configure one of the configuration registers 41 of the interface module 5 with the expected value (that is, in case wherein there are no faults in the digital circuit 2) of the scan test signature generated as a function of the data generated by the digital circuit 2, as it will be explained more in detail afterwards. Specifically, in the hypothesis wherein the test of the digital circuit 2 is performed using the plurality N of scan chains 22 implemented inside the digital circuit 2, said shift register 40 comprises a plurality N of inputs and is commonly known as multiple input shift register (shortly MISR); in this case the scan test signature (for example, it is a digital signature, such as a multiple input cyclical redundancy code) is calculated as a function of the data received from the plurality N of the output test terminals $S1_{sco}$ of the digital circuit 2.

It will be described the operation of the integrated circuit 100, referring also to FIGS. 1 and 2.

In order to explain the operation, for the sake of simplicity it is supposed that the digital circuit 2 comprises a combinatorial logic and a sequential logic composed of three flip-flops and it is supposed that the test of the digital circuit 2 is performed by means of the test operation mode which configures the digital circuit 2 in order to switch between the shift register condition and the normal operation condition. Specifically, in the shift register condition a scan chain 22 is configured inside the digital circuit 2, wherein said scan chain is composed of a chain of said three flip-flops configured by means of the at least one input test control signal $S1_{sci\_c}$ and wherein the chain of the three flip-flops is functionally equivalent to a shift register having a length of three; said three flip-flops are the same used (when the digital circuit 2 is in the normal operation mode) for implementing a generic logic function in the digital circuit 2. Therefore in this hypothesis the output test terminal 31 is a single terminal such to generate a single output test signal $S1_{sco}$, the input test data terminal 30 is a single terminal such to receive a single input test data signal $S1_{sci\_d}$, the output terminal 38 of the controller 3 is a single terminal that provides a single test pattern sequence signal $S_{st}$ generated by the controller 3, the input data terminal D of the memory 14 is a single terminal such to receive the output test signal $S1_{sco}$ and also the output data terminal O of the memory 14 is a single terminal.

The time instants $t_o, t_1, \ldots$ used for explaining the operation are for example temporally subsequent edges (also not consecutive) of the clock signal used by the test system 1.

It is supposed that at the initial time instant $t_0$ the digital circuit 2 is in the normal operation mode and the application module 19 runs one or more user applications by means of the digital circuit 2. For example, the integrated circuit 100 is mounted on a vehicle, which is operative. Specifically, the application module 19 generates some logic values of the plurality of the input user signals $S1_{iu}$. The digital circuit 2 receives said logic values of the plurality of input user signals $S1_{iu}$ and, as a function of them and of the status of the digital circuit 2, generates some logic values of the plurality of output user signals $S1_{ou}$. The application module 19 receives said logic values of the plurality of the output user signals $S1_{ou}$ which are processed by the circuits of the application module 19.

Moreover, at the initial time instant $t_0$, the test system 1 is in a stand-by condition. Specifically, the state machine 6 is in a condition waiting to read (by means of the internal interface signals $S_{itf\_int}$) from one of the registers 41 of the interface module 5 a value indicating the activation of the test: said register will be referred in the following as "activation register".

At the time instant $t_1$ (subsequent to $t_0$), the application module 19 transmits to the interface module 5 the parameters for executing the test operation mode by means of the output interface signals $S_{itf}$. The interface module uses the parameters to configure a part of the configuration registers 41 in the interface module 5. For example, the execution parameters are the number of the scan chains 22 in the digital circuit 2 (which, for the sake of simplicity in the embodiment of FIG. 2, it is supposed to be equal to one), the length of the scan chains (which, for the sake simplicity, it is supposed to be equal to three), the number of the test pattern sequences to be generated (that, for the sake of simplicity it is supposed equal to two) and the expected value (that is in the case wherein there are no faults in the digital circuit 2) of the scan test signature. Therefore at the time instant $t_1$ the interface module 5 receives the execution parameters by means of the output interface signals $S_{itf}$ configuring in said configuration registers 41 the values of the execution parameters.

At the time instant $t_2$ (subsequent to $t_1$) the digital circuit 2 is inactive, that is the digital circuit 2 receives a supply voltage, but its non-test operation is not required. For example, in case the digital circuit 2 is a communications peripheral, at the time instant $t_2$ the peripheral does no require data transmission or reception. At the time instant $t_2$ the application module 19 decides to perform the digital circuit 2 test and configures (by means of a communications protocol on the interface signals $S_{itf}$) the activation register in the interface module 5 at a value indicating the activation of the test. The state machine 6 detects the value of the activation register indicating the activation of the test and thus detects the request to execute the test of the digital circuit 2: therefore the test operation mode is activated.

Therefore the application module 19 can activate the test operation mode during a time slot wherein the digital circuit 2 is inactive, that is its non-test operation is not being executed. In the example wherein the digital circuit 2 is a communications peripheral, the test operation mode is activated during a time slot wherein the peripheral does not require data transmission or reception.

Specifically, at the time instant $t_2$ it is executed the configuration phase wherein the state machine 6 generates at one of the output terminals 46 one of the input test control signals $S1_{sci\_c}$ having a value which masks possible transitions of the input user signals $S1_{iu}$ and which drives the output user signals $S1_{ou}$ to values indicating a stand-by condition.

Moreover, at the time instant $t_2$ the state machine 6 reads from the interface module 5 the values of the execution parameters in the configuration registers 41 by means of the internal interface signals $S_{itf\_int}$ and transmits the read values of the execution parameters to the controller 3 by means of the control and programming signals $S_{prg\_ctrl}$. The controller 3 receives from the state machine 6 by means of the control and programming signals $S_{prg\_ctrl}$ the values of the execution parameters and, preferably, stores them into registers. Moreover, the controller 3 generates at one of the output terminals 44 one of the result and control signals $S_{res\_ctrl}$ with a value indicating a request of configuration of the digital circuit 2 in the shift register condition. The state machine 6 receives said value of the result and control signal $S_{res\_ctrl}$ indicating the configuration request of the digital circuit 2 in the shift register condition and generates therefrom at one of the output terminals 46 one of the input test control signals $S1_{sci\_c}$ with a value configuring the digital circuit 2 in the shift register condition, that is it configures inside the digital circuit 2 the scan chain 22 composed of three flip-flops functionally equivalent to a shift register having a length of three; specifically, it will be indicated with "first flip-flop" the one connected to the output test terminal 31, with "third flip-flop" the one connected to the input test data terminal 30 and with "second flip-flop" the one connected between the output of the third and the input of the first flip-flop.

At the time instant $t_3$ (subsequent to $t_2$) it is executed the status storage phase, wherein it is stored a first portion of the status at the time instant $t_2$ of the digital circuit 2 into the memory 14: the state machine 6 generates the signals for performing the storage into the memory 14 of the first part of the status at the time instant $t_2$ of the digital circuit 2, wherein said first portion consists of the value stored at the time instant $t_2$ into the first flip-flop of the scan chain.

Specifically, at the time instant $t_3$ the controller 3 generates at one of the output terminals 44 one of the result and control signals $S_{res\_ctrl}$ having a value indicating a request of status storage. The state machine 6 receives said value of the result and control signal $S_{res\_ctrl}$ indicating the status storage request, generates therefrom the initialization signal $S_{rst\_en}$ having a high logic value, generates the write increase signal $S_{fld}$ having a high logic value, and generates one of the input test control signals $S1_{sci\_c}$ with a value such that the digital circuit 2 generates first data of the scan chain. Said first data are the first portion of the digital circuit 2 status consisting of the value stored at the time instant $t_2$ into the first flip-flop of the scan chain. The counter 13 receives the initialization signal $S_{rst\_en}$ having the high logic value initializing the counter 13 at an initial value, which is supposed for the sake of simplicity to be equal to zero: therefore the counter 13 generates at the output the count signal having a value equal to zero. The OR logic cell 12 receives at the first input the write increase signal $S_{fld}$ having the high logic value, receives at the second input the read increase value $S_{dwld}$ having a low logic value and generates at the output terminal a high logic value. The memory 14 receives from the OR logic cell 12 at the enable terminal CS the high logic value enabling the access to the memory 14, receives at the write enable terminal W the write increase signal $S_{fld}$ having the high logic value enabling the write operation into the memory 14, receives from the counter 13 on the address bus IND the logic value equal to zero, and receives from the digital circuit 2 by means of the output test signal $S1_{sco}$ the value of the first flip-flop of the scan chain. Thus, said value of the first flip-flop is written into the memory 14 by means of the input data terminal D at the address of the memory 14 equal to zero.

Afterwards, the state machine 6 generates a value of one of the input test control signals $S1_{sci\_c}$ which performs the shift of one position of the values stored into the three flip-flops of the scan chain, that is the value stored into the first flip-flop is transmitted over the output test terminal 31 of the digital circuit 2, the value stored into the second flip-flop is shifted into the first flip-flop and the value stored into the third flip-flop is shifted into the second flip-flop.

Advantageously, in the status storage phase it is also initialized the scan chain. Specifically, at the time instant $t_3$ (after having stored the value of the first flip-flop into the memory 14 and at the same time as the shift of one position of the values stored into the three flip-flops of the scan chain) the controller 3 generates at its output terminal 38 a first value of the sequence signal of a first test pattern $S_{st}$, the state machine 6 generates the read increase signal $S_{dwld}$ having a low logic value enabling the multiplexer 15 to transmit the first value of the sequence signal of the first test pattern $S_{st}$ over its output terminal. The multiplexer 15 receives at the first input terminal the first value of the sequence signal of the first test pattern $S_{st}$, receives at the input selection terminal the read increase signal $S_{dwld}$ having the low logic value and transmits over its output terminal the first value of the sequence signal of the first test pattern $S_{st}$. The memory module 7 transmits over its output terminal 37 the first value of the sequence signal of the first test pattern $S_{st}$, the digital circuit 2 receives at the input test data terminal 30 the input test data signal $S1_{sci\_d}$ equal to the first value of the sequence signal of the first test pattern $S_{st}$, which is stored into the third flip-flop of the scan chain. Therefore at the time instant $t_3$ it is initialized the third flip-flop of the scan chain. It has to be observed that the generation of the first value of the sequence signal of the first test pattern $S_{st}$ is substantially at the same time (for example, it occurs in the same period of the clock signal, in this case in a period comprised between $t_3$ and $t_4$) with the storage into the memory 14 of the value stored at the time instant $t_2$ into the first flip-flop of the scan chain; moreover, the generation of the first value of the sequence signal of the first test pattern $S_{st}$ and its reception at the input test data terminal 30 are performed at the same time as the shift of the positions of the scan chain.

At the time instant $t_4$ (subsequent to $t_3$) the state machine 6 generates the signals for performing the storage into the memory 14 of a second portion of the status at the time instant $t_2$ of the digital circuit 2, wherein said second portion consists of the value stored at the time instant $t_2$ into the second flip-flop of the scan chain.

Specifically, at the time instant $t_4$ the controller 3 generates at one of the output terminals 44 one of the result and control signals $S_{res\_ctrl}$ with a value indicating a request of status storage. The state machine 6 receives said value of the result and control signal $S_{res\_ctrl}$ indicating the status storage request and generates therefrom the initialization signal $S_{rst\_en}$ having the low logic value, generates the write increase signal $S_{fld}$ having the high logic value and generates a value of one of the input test control signals $S1_{sci\_c}$ so that the digital circuit 2 generates second data of the scan chain, wherein said second data are the second portion of the status of the digital circuit 2 consisting of the value stored at the time instant $t_2$ into the second flip-flop of the scan chain. The counter 13 receives the write increase signal $S_{fld}$ having a high logic value, increases the value of its counter from zero to one and generates at the output the count signal having a value equal to one. The OR logic cell 12 receives at the first input the write increase signal $S_{fld}$ having a high logic value, receives at the second input terminal the read increase signal $S_{dwld}$ having a low logic value and generates at the output terminal a high logic value. The memory 14 receives from the OR logic cell 12 at the enable terminal CS the high logic value enabling the access to the memory 14, receives at the write enable terminal W the write increase signal $S_{fld}$ having the high logic value enabling the write operation into the memory 14, receives from the counter 13 at the address bus IND the value equal to one, receives from the digital circuit 2 by means of the output test signal $S1_{sco}$ the value of the first flip-flop (equal to the value at the time instant $t_2$ of the second flip-flop) of the scan chain, then said value of the first flip-flop is written into the memory 14 by means of the input data terminal D at the address of the memory 14 equal to one.

Afterwards, the state machine 6 generates a value of one of the input test control signals $S1_{sci\_c}$, causing the shift of one position of the values stored into the flip-flops of the scan chain 22, that is the value stored into the second flip-flop is shifted into the first flip-flop and the value stored into the third flip-flop is shifted into the second flip-flop.

Advantageously, at the time instant $t_4$ (after the storage into the memory 14 and at the same time as the shift of one position of the values stored into the three flip-flops of the scan chain) the controller 3 generates at its output terminal 38 a second value of the sequence signal of the first test pattern $S_{st}$, the state machine 6 generates the read increase signal $S_{dwld}$ having the low logic value enabling the multiplexer 15 to transmit the second value of the sequence signal of the first test pattern $S_{st}$ over its output terminal. The multiplexer 15 receives at the first input terminal the second value of the sequence signal of the first test pattern $S_{st}$, receives at the input selection terminal the read increase signal $S_{dwld}$ having the low logic value and transmits over its output terminal the second value of the sequence signal of the first test pattern $S_{st}$. The memory module 7 transmits over its output terminal 37 the second value of the sequence signal of the first test pattern $S_{st}$, the digital circuit 2 receives at the input test data terminal the second value of the sequence signal of the first test pattern $S_{st}$, which is stored into the third flip-flop of the scan chain. Therefore at the time instant $t_4$ the second and third flip-flops of the scan chain are initialized. It has to be observed that the generation of the second value of the sequence signal of the first test pattern $S_{st}$ is substantially at the same time (for example, it occurs in the same period of the clock signal, in this case in the period comprised between $t_4$ and $t_5$) with the storage into the memory 14 of the value stored at the time instant $t_2$ into the second flip-flop of the scan chain; moreover, the generation of the second value of the sequence signal of the first test pattern $S_{st}$ and its reception on the input test data terminal 30 are performed at the same time as the shift of the positions of the scan chain.

At the time instant $t_5$ (subsequent to $t_4$) the state machine 6 generates the signals for performing the storage into the memory 14 of a third portion of the status at the time instant $t_2$ of the digital circuit 2, wherein said third portion consists of the value stored at the time instant $t_2$ into the third flip-flop of the scan chain. The operation is similar to the one at the time instant $t_4$ regarding the storage of the second portion of the status and thus the value of the first flip-flop (equal to the value at the time instant $t_2$ of the third flip-flop) of the scan chain is written into the memory 14. Advantageously, a third value of the sequence signal of the first test pattern $S_{st}$ is stored into the third flip-flop of the scan chain and at the same time the state machine 6 generates a value of one of the input test control signals $S1_{sci\_c}$ performing the shift of one position of the values stored into the flip-flops of the scan chain, that is the value stored into the second flip-flop (storing the first value of the sequence signal of the first test pattern $S_{st}$) is shifted into the first flip-flop and the value stored into the third flip-flop (storing the second value of the sequence signal of the first test pattern $S_{st}$) is shifted into the second flip-flop and the third value of the sequence signal of the first test pattern $S_{st}$ is stored into the third flip-flop. Therefore at the time instant $t_5$, the first, second and third flip-flops of the scan chain are initialized. It has to be observed that the generation of the third value of the sequence signal of the first test pattern $S_{st}$ is substantially at the same time (for example, it occurs in the same period of the clock signal, in this case in the period comprised between $t_5$ and $t_6$) with the storage into the memory 14 of the value stored at the time instant $t_2$ into the third flip-flop of the scan chain; moreover, the generation of the third value of the sequence signal of the first test pattern $S_{st}$ and its reception at the input test data terminal 30 are performed at the same time as the shift of the positions of the scan chain described above.

At the time instant $t_6$ (subsequent to $t_5$) the status storage phase ends. Specifically, the state machine 6 generates the write increase signal $S_{fld}$ having a low logic value and the read increase signal $S_{dwld}$ having the low logic value. The OR logic cell 12 receives at the first input terminal the write increase signal $S_{fld}$ having the low logic value, receives at the second input terminal the read increase signal $S_{dwld}$ having the low logic value and generates at the output terminal the first memory enabling signal $S_{mem\_en}$ having a low logic value. The memory 14 receives from the OR logic cell 12 at the enable terminal CS the first memory enabling signal $S_{mem\_en}$ having a low logic value, disabling the access to the memory 14.

At the time instant $t_7$ (subsequent to $t_6$) it starts the execution phase of the test operation mode, wherein the test system 1 performs the test of the digital circuit 2 and verifies if there are faults in the digital circuit 2. Specifically, the controller 3 generates at one of the output terminals 44 one of the result and control signals $S_{res\_ctrl}$ with a value indicating a configuration request of the digital circuit 2 in the normal operation condition (indicated also by a "capture" condition) wherein the three flip-flops in the digital circuit 2 are configured for implementing the generic logic function of the digital circuit 2 (that is the same function which is implemented when the digital circuit 2 is in the normal operation mode). The state machine 6 receives the value of said result and control signal $S_{res\_ctrl}$ indicating the configuration request of the digital circuit 2 in the normal operation mode and generates therefrom at one of the output terminals 46 one of the input test control signals $S1_{sci\_c}$ with a value configuring the digital circuit 2 in the normal operation mode, that is configures inside the digital circuit 2 the three flip-flops implementing the generic logic function of the digital circuit 2.

At the time instant $t_8$ the digital circuit 2 (which is in the normal operation mode) updates the next state value of the three flip-flops as a function of the current state (which was initialized in the preceding shift register condition of the storage step) of the three flip-flops.

At the time instant $t_9$ the digital circuit 2 goes back to the shift register condition. Specifically, the controller 3 generates at one of the output terminals 44 one of the result and control signals $S_{res\_ctrl}$ with a value indicating a configuration request of the digital circuit 2 in the shift register condition. The state machine 6 receives said value of the result and control signal $S_{res\_ctrl}$ indicating the configuration request of the digital circuit 2 in the shift register condition and generates therefrom at one of the output terminals 46 one of the input test control signals $S1_{sci\_c}$ with a value configuring the digital circuit 2 in the shift register condition.

At the time instant $t_9$ the digital circuit 2 generates on the output test signal $S1_{sco}$ the value stored into the first flip-flop, then the controller 3 receives from the input terminal 39 the output test signal $S1_{sco}$ having the value stored into the first flip-flop, calculates the scan test signature updating its value as a function of the value stored into the first flip-flop and stores the calculated value of the scan test signature into the shift register 40.

Afterwards the state machine 6 generates a value of one of the input test control signals $S1_{sci\_c}$ performing the shift of one position of the content of the three flip-flops of the scan chain.

Advantageously, at the time instant $t_9$ (after the update of the scan test signature and at the same time as the shift of one position of the values stored into the three flip-flops of the scan chain) the controller 3 generates at the output terminal 38 a first value of the sequence signal of a second test pattern $S_{st}$ and the state machine 6 generates the read increase signal $S_{dwld}$ having a low logic value enabling the multiplexer 15 to transmit the first value of the sequence signal of the second test pattern $S_{st}$ over its output terminal. The multiplexer 15 receives at the first input terminal the first value of the sequence signal of the second test pattern $S_{st}$, receives at the input selection terminal the read increase signal $S_{dwld}$ having the low logic value and transmits over its output terminal the first value of the sequence signal of the second test pattern $S_{st}$. The memory module 7 transmits over its output terminal 37 the first value of the sequence signal of the second test pattern $S_{st}$, the digital circuit 2 receives at the input test data terminal 30 the input test data signal $S1_{sci\_c}$ equal to the first value of the sequence signal of the second test patterns $S_{st}$, which is stored into the third flip-flop of the scan chain.

The execution phase of the test operation mode continues at the time instants $t_{10}$ (subsequent to $t_9$) and $t_{11}$ (subsequent to $t_{10}$).

At the time instant $t_{10}$ the digital circuit 2 generates on the output test signal $S1_{sco}$ the value stored into the first flip-flop, then the controller 3 receives from the input terminal 39 the output test signal $S1_{sco}$ having the value stored into the first flip-flop, calculates the scan test signature updating its value as a function of the value stored into the first flip-flop and stores the calculated value of the scan test signature into the shift register 40.

Afterwards, the state machine 6 generates a value of one of the input test control signals $S1_{sci\_c}$ performing the shift of one position of the content of the three flip-flops of the scan chain.

Advantageously, at the time instant $t_{10}$ (after the update of the scan test signature and at the same time as the shift of one position of the values stored into the three flip-flops of the scan chain), the controller 3 generates at the output terminal 38 a second value of the sequence signal of the second test pattern $S_{st}$ and the state machine 6 generates the read increase signal $S_{dwld}$ having a low logic value enabling the multiplexer 15 to transmit the second value of the sequence signal of the second test pattern $S_{st}$ over its output terminal. The multiplexer 15 receives at the first input terminal the second value of the sequence signal of the second test pattern $S_{st}$, receives at the input selection terminal the read increase signal $S_{dwld}$ having the low logic value and transmits over its output terminal the second value of the sequence signal of the second test pattern $S_{st}$. The memory module 7 transmits over its output terminal 37 the second value of the sequence signal of the second test pattern $S_{st}$, the digital circuit 2 receives at the input test data terminal 30 the input test data signal $S1_{sci\_d}$ equal to the second value of the sequence signal of the second test pattern $S_{st}$, which is stored into the third flip-flop of the scan chain.

At the time instant $t_{11}$ the digital circuit 2 generates at the output test signal $S1_{sco}$ the value stored into the first flip-flop, then the controller 3 receives from the input terminal 39 the output test signal $S1_{sco}$ having the value stored into the first flip-flop, calculates the scan test signature updating its value as a function of the value stored into the first flip-flop and stores the calculated value of the scan test signature into the shift register 40.

Afterwards, the state machine 6 generates a value of one of the input test control signals $S1_{sci\_c}$ performing the shift of one position of the contents of the three flip-flops of the scan chain.

Advantageously, at the time instant $t_{11}$ (after the update of the scan test signature and at the same time as the shift of one position of the values stored into the three flip-flops of the scan chain) the controller 3 generates at the output terminal 38 a third value of the sequence signal of the second test pattern $S_{st}$ and the state machine 6 generates the read increase signal $S_{dwld}$ having a low logic value enabling the multiplexer 15 to transmit the third value of the sequence signal of the second test pattern $S_{st}$ over its output terminal. The multiplexer 15 receives at the first input terminal the third value of the sequence signal of the second test pattern $S_{st}$, receives at the input selection terminal the read increase signal $S_{dwld}$ having the low logic value and transmits over its output terminal the third value of the sequence signal of the second test pattern $S_{st}$. The memory module 7 transmits over its output terminal 37 the third value of the sequence signal of the second test pattern $S_{st}$, the digital circuit 2 receives at the input test data terminal 30 the input test data signal $S1_{sci\_d}$ equal to the third value of the sequence signal of the second test pattern $S_{st}$, which is stored into the third flip-flop of the scan chain.

At the time instant $t_{12}$ the digital circuit 2 goes back to the normal operation condition (capture) and its behavior is similar to what has been described at the time instant $t_7$.

It is supposed for the sake of simplicity to use a sequence composed of only two test patterns $S_{st}$. In the hypothesis of using a sequence comprising further test patterns $S_{st}$, the execution phase of the test continues similarly to what has been described at the time instants $t_7$-$t_{11}$, that is the state machine 6 during the phase of executing the test configures the digital circuit 2 so that it switches between the shift register condition (wherein the three flip-flops compose the scan chain equivalent to a shift register, similarly to the time instants $t_9$-$t_{11}$) and the normal operation condition—that is capture—(wherein the three flip-flops operate for implementing the generic logic function in the digital circuit 2, similarly to the time instants $t_7$-$t_8$), for a number of times depending on the number of sequences of the test pattern $S_{st}$ configured in the execution parameters stored into one of the configuration registers 41.

At a time instant $t_{20}$ (subsequent to $t_{12}$) it is executed the status loading phase, wherein the status of the digital circuit 2 stored into the memory 14 is loaded and the status at the time instant $t_2$ of the digital circuit 2 is restored, that is the value at the time instant $t_2$ of the three flip-flops of the scan chain 22.

Therefore at the time instant $t_{20}$ the controller 3 generates at one of the output terminals 44 one of the result and control signals $S_{res\_ctrl}$ with a value indicating a configuration request of the digital circuit 2 in the shift register condition. The state machine 6 receives said value of the result and control signal $S_{res\_ctrl}$ indicating the configuration request of the digital circuit 2 in the shift register condition and generates therefrom at one of the output terminals 46 one of the input test control signals $S1_{sci\_c}$ with a value configuring the digital circuit 2 in the shift register condition, that is it configures inside the digital circuit 2 the scan chain 22 composed of the three flip-flops functionally equivalent to a shift register having a length of three.

Moreover, at the time instant $t_{20}$ the controller 3 generates at one of the output terminals 44 one of the result and control signals $S_{res\_ctrl}$ with a value indicating a status loading request. The state machine 6 receives said value of the result and control signal $S_{res\_ctrl}$ indicating the status loading request and generates therefrom the signals for restoring the status at the time instant $t_2$ of the digital circuit 2. Specifically, the state machine 6 generates the initialization signal $S_{rst\_en}$ having a high logic value, generates the write increase signal $S_{fld}$ having a low logic value and generates the read increase signal $S_{dwld}$ having a high logic value. The counter 13 receives the initialization signal $S_{rst\_en}$ having the high logic value initializing the counter 13 at the same initial value of the status storage phase, which was supposed to be equal to zero: therefore the counter 13 generates at the output the count signal having a value equal to zero. The OR logic cell 12 receives at the first input terminal the write increase signal $S_{fld}$ having the low logic value, receives at the second input terminal the read increase signal $S_{dwld}$ having the high logic value and generates at the output terminal the first memory enable signal $S_{mem\_en}$ having the high logic value. The memory 14 receives from the OR logic cell 12 at the enable terminal CS the high logic value enabling the access to the memory 14, receives at the write enable terminal W the write increase signal $S_{fld}$ having the low logic value enabling the read operation from the memory 14 and receives from the counter 13 on the address bus IND the value equal to zero, then generates at the output data terminal O the data stored into the memory 14 at the address equal to zero, that is the first part of the status at the time instant $t_2$ of the digital circuit 2, wherein said first portion of the status is the value stored at the time instant $t_2$ of the first flip-flop of the scan chain of the digital circuit 2. The multiplexer 15 receives at the second input terminal the data read at the address equal to zero, receives at the input selection terminal the read increase signal $S_{dwld}$ having the high logic value and transmits over its output the input test data signal $S1_{sci\_d}$ equal to the data read at the address equal to zero (that is, the value stored at the time instant $t_2$ into the first flip-flop of the scan chain of the digital circuit 2). The digital circuit 2 receives at the input test data terminal 30 the input test data signal $S1_{sci\_d}$ equal to the data read from the memory 14 at the address equal to zero.

Moreover the controller 3 generates at one of the output terminals 44 one of the result and control signals $S_{res\_ctrl}$ having a value indicating a request for shifting the scan chain. The state machine 6 receives said value of the result and control signal $S_{res\_ctrl}$ indicating the shift request and it generates therefrom a value of one of the input test control signals $S1_{sci\_c}$ that causes the shift of one position of the contents of the flip-flops of the scan chain; consequently, the data read from the memory 14 at the address equal to zero (that is, the value of the first flip-flop of the digital circuit 2 at the time instant $t_2$) are stored into the third flip-flop of the digital circuit 2, thus restoring the first part of the status at the time instant $t_2$ of the digital circuit 2.

At the time instant $t_{21}$ (subsequent to $t_{20}$) the controller 3 generates at one of its output terminals 44 one of the result and control signals $S_{res\_ctrl}$ with a value indicating a status loading request. The state machine 6 receives said value of the result and control signal $S_{res\_ctrl}$ indicating the status loading request and generates therefrom the signals for restoring from the memory 14 the second part of the status at the time instant $t_2$ of the digital circuit 2, wherein said second part of the status is the value stored at the time instant $t_2$ of the second flip-flop of the scan chain of the digital circuit 2. Specifically, the state machine 6 generates the initialization signal $S_{rst\_en}$ having a low logic value, generates the write increase signal $S_{fld}$ having a low logic value and generates the read increase signal $S_{dwld}$ having the high logic value. The counter 13 receives the read increase signal $S_{dwld}$ having the high logic value, increases the value of its counter from zero to one and generates at the output the count signal having a value equal to one. The OR logic cell 12 receives at the second input the read increase signal $S_{dwld}$ having the high logic value and generates at the output terminal a high logic value. The memory 14 receives from the OR logic cell 12 at the enable terminal CS the high logic value enabling the access to the memory 14, receives at the write enable terminal W the write increase signal $S_{fld}$ having the low logic value enabling the read operation from the memory 14 and receives from the counter 13 on the address bus IND the value equal to one, then generates at the output data terminal O the data stored into the memory 14 at the address equal to one, that is the second part of the status at the time instant $t_2$ of the digital circuit 2. The multiplexer 15 receives at the second input terminal the data read at the address equal to one, receives at the input selection terminal the read increase signal $S_{dwld}$ having the high logic value and transmits over its output the input test data signal $S1_{sci\_d}$ equal to the data read at the address equal to one (that is the value stored at the time instant $t_2$ into the second flip-flop of the scan chain of the digital circuit 2). The digital circuit 2 receives at the input test data terminal 30 the input test data signal $S1_{sci\_d}$ equal to the data read from the memory 14 at the address equal to one.

Moreover, the controller 3 generates at one of the output terminals 44 one of the result and control signals $S_{res\_ctrl}$ with a value indicating a request for shifting of the scan chain 22. The state machine 6 receives said value of the result and control signal $S_{res\_ctrl}$ indicating the shift request and generates therefrom a value of one of the input test control signals $S1_{sci\_c}$ which causes the shift of one position of the content of the flip-flops of the scan chain; consequently, the data read from the memory 14 at the address equal to one (that is the value of the second flip-flop of the digital circuit 2 at the time instant $t_2$) are stored into the third flip-flop of the digital circuit 2, thus restoring the second part of the status at the time instant $t_2$ of the digital circuit 2.

At the time instant $t_{22}$ (subsequent to $t_{21}$) the controller 3 generates at one of the output terminals 44 one of the result and control signals $S_{res\_ctrl}$ with a value indicating a status loading request. The state machine 6 receives said value of the result and control signal $S_{res\_ctrl}$ indicating the status loading request and generates therefrom the signals for performing the restore from the memory 14 of the data read from the memory 14 at the address equal to two, that is the third part of the status at the time instant $t_2$ of the digital circuit 2, wherein said third part of the status is the value stored at the time instant $t_2$ into the third flip-flop of the scan chain of the digital circuit 2. The operation is similar to that at the time instant $t_{21}$ with reference to the restore of the second part of the status. In this case, the controller 3 generates at one of the output terminals 44 one of the result and control signals $S_{res\_ctrl}$ with a value indicating a shift request of the scan chain. The state machine 6 receives said value of the result and control signal $S_{res\_ctrl}$ indicating the shift request and generates therefrom a value of one of the input test control signals $S1_{sci\_c}$ which causes the shift of one position of the content of the flip-flops of the scan chain; consequently, the data read from the memory 14 at the address equal to two (that is the value of the third flip-flop of the digital circuit 2 at the time instant $t_2$) are stored into the third flip-flop of the digital circuit 2, thus restoring the third part of the status at the time instant $t_2$ of the digital circuit 2.

Therefore at the time instant $t_{22}$ it has been restored the status at the time instant $t_2$ of the digital circuit 2.

At the time instant $t_{23}$ (subsequent to $t_{22}$) the status loading phase ends. Specifically, the state machine 6 generates at one of the output terminals 46 one of the input test control signals $S1_{sci\_c}$ having a value removing the masking of the transitions of the input user signals $S1_{iu}$ and removing the values of the stand-by condition driven on the output user signals $S1_{ou}$. Moreover, the state machine 6 generates the write increase signal $S_{fld}$ having a low logic value and the read increase signal $S_{dwld}$ having the low logic value. The OR logic cell 12 receives at the first input terminal the write increase signal $S_{fld}$ having the low logic value, receives at the second input terminal the read increase signal $S_{dwld}$ having the low logic value and generates at the output terminal the first memory enable signal $S_{mem\_en}$ having a low logic value. The memory 14 receives at the enable terminal CS the first memory enable signal $S_{mem\_en}$ having the low logic value, which disables the access to the memory 14.

At the time instant $t_{24}$ (subsequent to $t_{23}$) the digital circuit 2 and the test system 1 enter the result check phase. The state machine 6 receives from the controller 3 (by means of at least one of the result and control signals $S1_{res\_ctrl}$) the calculated value of the scan test signature stored into the shift register 40, receives the expected value of the scan test signature from one of the registers 41 of the interface module 5 by means of the internal interface signals $S_{itf\_int}$ and performs the comparison between the calculated value of the scan test signature and the expected value of the scan test signature: in case the calculated and expected values of the scan test signature are equal, the state machine 6 generates the test result signal $S_{pf}$ having a high logic value indicating that the test had a positive result, that is there were no faults detected in the digital circuit 2, otherwise the state machine 6 generates the test result signal $S_{pf}$ having a low logic value indicating that the test had a negative result, that at least one fault has been detected in the digital circuit 2.

At the time instant $t_{25}$ the state machine 6 writes (by means of one of the output internal interface signals $S_{itf\_int}$) into the activation register in the interface module 5 a value indicating the deactivation of the test. Moreover, the controller 3 generates at one of the output terminals 44 one of the result and control signals $S_{res\_ctrl}$ with a value indicating a configuration request of the digital circuit 2 in the normal operation condition wherein the three flip-flops in the digital circuit 2 are configured for implementing the generic logic function in the digital circuit 2 (for example, the controller 3 generates one of the result and control signals $S_{res\_ctrl}$ with a value indicating that the generation of the sequences of the test patterns $S_{st}$ has ended). The state machine 6 receives the value of said result and control signal $S_{res\_ctrl}$ indicating the configuration request of the digital circuit 2 in the normal operation condition (in the example, the state machine receives said value indicating the end of the generation of the sequences of the test patterns $S_{st}$) and generates therefrom at one of the output terminals 46 one of the input test control signals $S1_{sci\_c}$ with a value configuring the three flip-flops for implementing the generic logic function of the digital circuit 2.

At the time instant $t_{26}$ the application modules 19 reads (periodically or after the reception of an interrupt signal) from the interface module 5 (by means of one of the interface signals $S_{ift}$) the activation register having the value indicating the deactivation of the test and thus detects that the test of the digital circuit 2 has been executed. The application module 19 receives the test result signal $S_{pf}$ and detects the positive or negative result of the test of the digital circuit 2.

At the time instant $t_{27}$ the digital circuit 2 goes back to the normal operation mode.

It has to be observed that in the status storage phase (specifically, at the time instants $t_3$, $t_4$, $t_5$) it is possible to perform both the storage of the status of the digital circuit 2 and the generation of the sequence signal of the first test patterns $S_{st}$, that will be used in the subsequent execution phase of the test for generating the output test signal $S1_{sco}$: said generation of the sequence signal of the first test pattern $S_{st}$ can be also considered a first step of the phase of executing the test. This has the advantage of reducing the time for performing the test of the digital circuit 2 and of simplifying the implementation of the state machine 6: in fact at the time instant ($t_7$) wherein the execution phase is activated, it is already possible to start the test by configuring the digital circuit 2 in the normal operation condition (capture) and (at the time instant $t_8$) it is already possible to update the value of the next state of the flip-flops. Similarly, at the end of the execution phase it is possible not only to perform the test of the digital circuit 2, but it is also possible (for example, at the same clock edge of the clock signal) to start loading the status of the digital circuit 2 from the memory 14.

It has to be observed that, for the sake of simplicity, it has been described the operation of the integrated circuit 100 in the hypothesis wherein the test has been performed using one scan chain 22, but more in general it is possible to perform the test using a plurality N of scan chains (each one comprising one or more flip-flops) also of a different length, N being greater than 1. In this case, in the embodiment of the memory module 7 of FIG. 2 the at least one input test data terminal 30 is a bus of size N (equal to the number N of the scan chains) such to carry a plurality N of the input test data signals $S1_{sci\_d}$, the at least one output test terminal 31 is a bus of size N (equal to the number N of the scan chain) such to carry a plurality N of output test signals $S1_{sco}$, the at least one input data terminal D of the memory 14 is a bus of size N (equal to the number N of the scan chains 22), the at least one output data terminal O is a bus of size N (equal to the number N of the scan chains), the at least one second input terminal 42 is a bus of size N (equal to the number N of the scan chains) such to generate a plurality N of sequence signals of the test patterns $S_{st}$ and the multiplexer 15 has input and output terminals which are buses of size N.

In the hypothesis wherein the plurality N of scan chains 22 has a different length, it is possible to compensate for the different length of the chains by using delay blocks between the memory module 7 and the digital circuit 2.

Moreover, in the hypothesis of performing the test using a plurality N of scan chains 22, each one composed of three flip-flops, at the time instant $t_3$ it is stored into the memory 14 the value at the time instant $t_2$ of the first flip-flop of the plurality N of the scan chains, at the time instant $t_4$ it is stored into the memory 14 the value at the time instant $t_2$ of the second flip-flop of the plurality N of scan chains and at the time instant $t_5$ it is stored into the memory 14 the value at the time instant $t_2$ of the third flip-flop of the plurality N of scan chains.

In the hypothesis of performing the test using a plurality N of scan chains 22, in the embodiment of the memory module 107 of FIG. 3 the multiplexer 15 has N input and output terminals.

It has to be observed that with reference to the sizes of the terminals 31 (33, 36), D, O, 37 (32, 30), are also possible other embodiments of the memory module 7, 107 intermediate between those shown in FIG. 2 (wherein the size N of the memory 14 is equal to the number N of the scan chains 22) and in FIG. 3 (wherein it is supposed to have a single input terminal 36 corresponding to one scan chain, while the memory 14 has a size N greater than 1 equal to the number of the scan chains).

For example, it is possible a variant of the embodiment of FIG. 3 wherein the test is performed using two scan chains 22 each one composed of 8 flip-flops and the input terminal 36 is a bus of size two equal to the number of the scan chains. The memory module 7 comprises two serial/parallel converters (similar to the serial/parallel converter 17) of size 8 (equal to the number of the flip-flops of the chains) and the input data terminal D is a bus of size 16 bits. In this example, the 16 bits of the input data terminal are composed of 8 output bits from one of the two serial/parallel converters and of further 8 output bits of the other of the two serial/parallel converters.

Moreover, it has to be observed that the disclosure can be applied also to other types of tests which do not use scan chains, such as for example the tests which automatically generate values (for example, pseudo-random values) of the input user signals $S1_{iu}$ at the input of the digital circuit 2 and verify if the generated values of the output user signals $S1_{ou}$ at the output of the digital circuit 2 are correct or verify if a signature, calculated by sampling the status of the output user signals $S1_{ou}$, is equal to an expected value of the signature.

Advantageously, the test operation mode is activated (see the time instant $t_1$ in the description regarding the operation) as a function of the quality specifications requested to the digital circuit 2: for example, if a high quality level is desired, the test operation mode is activated periodically with a determined period, while if a low quality level is desired the test operation mode is activated with a longer period.

Advantageously, according to a variant of the first embodiment of the disclosure (see FIG. 2 and FIG. 3) the memory module 7 further comprises:
  a first shift register 9 for storing the calculated value of a write signature (for example, a cyclic redundancy code) generated as a function of the status of the digital circuit 2 at the time instants wherein said status is stored into the memory 14 by the input data terminal D, wherein the write signature has a minimum size (for example, 16 bits, typically 32 bits) for reducing to the minimum the probability of masking the error also in case wherein the number N of the scan chains is low;

a second shift register 10 for storing the calculated value of a read signature (for example, a cyclic redundancy code) generated as a function of the status of the digital circuit 2 at time instants wherein said status is read from the memory 14 from the output terminal of the multiplexer 15, wherein the read signature has a minimum size (for example, 16 bits, typically 32 bits) for reducing to the minimum the probability of masking the error also when the number N of the scan chains 22 is low;

a comparator 11 which has the function of performing the comparison between the value of the first shift register 9 and the value of the second shift register 10, for verifying the correctness of the status of the digital circuit 2 stored into the memory 14, in order to detect faults which can occur during the operation of storing the status of the digital circuit 2 into the memory 14 and/or in the subsequent read operation of the status of the digital circuit 2 from the memory 14.

Specifically, in the hypothesis wherein the test of the digital circuit 2 is performed by means of a plurality N of scan chains 22 configured inside the digital circuit 2 and in the hypothesis wherein the data received from the plurality N of the scan chains carry the status of the digital circuit 2, the first shift register 9 and the second shift register 10 comprise each one a plurality N of inputs and are commonly indicated with multiple input shift registers (shortly MISR). In this case the write signature (for example, a multiple input cyclic redundancy code) is calculated as a function of the data received from the plurality N of the scan chains at the time instants wherein said status is stored into the memory 14 by means of the input data terminals D, while the read signature (for example, a multiple input cyclic redundancy code) is calculated as a function of the data stored into the memory 14 at the time instants wherein the data are read from the memory 14 and are transmitted over the output terminal of the multiplexer 15.

Moreover, the state machine 6 further comprises an output terminal 60 for generating a comparison enable signal $S_{en\_cmp}$ which has the function of enabling the comparator 11 and comprises an input terminal 64 for receiving from the memory module 7 a memory test signal $S_{ok}$; the memory module 7 further comprises an input terminal 51 for receiving from the state machine 6 the comparison enable signal $S_{en\_cmp}$ and the comparator 11 comprises an input terminal for receiving the comparison enable signal $S_{en\_cmp}$, a first input terminal for receiving the value of the first shift register 9, a second input terminal for receiving the value of the second shift register 10 and an output terminal for transmitting the memory test signal $S_{ok}$ having the high logic value in case the value of the first shift register 9 is equal to the value of the second shift register 10 and having the low logic value when they are different.

The operation of the variant of the first embodiment of the disclosure is similar to the one of the first embodiment and comprises the following further steps. When the digital circuit 2 and the test system 1 operate in the status storage phase of the test operation mode (time instants $t_3$, $t_4$, $t_5$), it is calculated the value of the write signature updating its value at the successive time instants $t_3$, $t_4$, $t_5$ and the calculated value is stored into the first shift register 9.

When the digital circuit 2 and the test system 1 operate in the status loading phase of the test operation mode (time instants $t_{20}$, $t_{21}$, $t_{22}$), it is calculated the read signature value by updating its value at the successive time instants $t_{20}$, $t_{21}$, $t_{22}$ and the calculated value is stored into the second shift register 10. Moreover, the state machine 6 generates the comparison enable signal $S_{en\_cmp}$ having a high logic value enabling the comparator 11 to perform the comparison between the value of the write signature and the value of the read signature: in case the values of the write and read signature are equal, the operations of storing the status of the digital circuit 2 and of loading the status have been correctly performed and the comparator 11 generates at its output the memory test signal $S_{ok}$ having the high logic value, while in case the values of the write and read signature are different, it occurred an error in the operation of storing the status of the digital circuit 2 and/or in the operation of loading the status and the comparator 11 generates on its output the memory test signal $S_{ok}$ having the low logic value.

When the digital circuit 2 and the test system 1 operate (at the time instant $t_{24}$) in the result check phase, the state machine 6 receives from the comparator 11 the memory test signal $S_{ok}$, receives from the controller 3 (by means of at least one of the result and control signals $S_{res\_ctrl}$) the calculated value of the scan test signature stored into the shift register 40, receives the expected value of the scan test signature from one of the registers 41 of the interface module 5 by means of the internal interface signals $S_{itf\_int}$, performs the comparison between the calculated value of the scan test signature and the expected value of the scan test signature, and generates the test result signal $S_{pf}$. The test result signal $S_{pf}$ has a low logic value, indicating that the test of the digital circuit 2 has not been successful, in case the memory test signal $S_{ok}$ has a low logic value or in case the calculated and expected values of the scan test signature are not equal, that is in case an error occurred in the storage and/or in the loading of the status of the digital circuit 2 into the memory 14 or an error in the test of the digital circuit 2 respectively. In the opposite case, the state machine 6 generates the test result signal $S_{pf}$ having a high logic value, indicating that the test of the digital circuit 2 has been successful, in case the memory test signal $S_{ok}$ has a high logic value and also in case the calculated and expected values of the scan test signature are equal, that is in case there were neither an error in the storage and/or in the loading of the status of the digital circuit 2 into the memory 14 nor an error of the test of the digital circuit 2 respectively.

In case wherein the memory module 7 is implemented as shown in FIG. 3, the operation of the integrated circuit 100 is similar to the one described with reference to the embodiment of FIG. 2, with the following differences. The state machine 6 generates a low logic value of the second memory enable signal $S_{cnt\_en}$ in the status storage phase until the serial/parallel converter 17 completes the conversion from serial to parallel of the data received (specifically, the status of the digital circuit 2) from the output test signal $S1_{sco}$, that is in the time interval for filling the shift register 17 with the serial data carried by the output test signal $S1_{sco}$. Specifically, the state machine 6 generates a low logic value of the second memory enable signal $S_{cnt\_en}$ and the memory 14 receives at the enable terminal CS the memory enable signal $S_{cnt\_en}$ having the low logic value disabling the access to the memory 14; moreover, the state machine 6 generates a high logic value of the write increase signal $S_{fld}$ performing the shift of the content of the shift register 17, the shift register 17 receives the high logic value of the write increase signal $S_{fld}$ performing the shift of the content of the shift register 17, which is filled with the data carried by the output test signal $S1_{sco}$ (specifically, with the status of the digital circuit 2). When the shift register 17 has been filled, the state machine 6 generates a high logic value of the memory enable signal $S_{cnt\_en}$ and the AND logic cell 16 generates a high logic value of the first memory enable signal $S_{mem\_en}$; the memory 14 receives at the enable terminal CS the memory enable signal $S_{scn\_en}$ having the high logic value enabling the access to the memory 14, receives at the write enable terminal W the write increase signal $S_{fld}$ having a high logic value enabling the write operation into the memory 14, the shift register 17 generates at the input data terminal D the parallel output test signal $S1_{sco\_p}$ carrying the status of the digital circuit 2 stored into the shift register 17 and said status is stored into the memory 14. Afterwards, the state machine 6 generates again the low logic value of the memory enable signal $S_{cnt\_en}$ and it is again performed the serial-parallel conversion of the data received from the output test signal $S1_{sco}$.

Similarly, in the status loading phase the state machine 6 generates the high logic value of the memory enable signal $S_{cnt\_en}$ and the AND logic cell 16 generates a high logic value of the first memory enable signal $S_{mem\_en}$. The memory 14 receives at the enable terminal CS the memory enable signal $S_{cnt\_en}$ having the high logic value enabling the access to the memory 14, receives at the write enable terminal W the write increase signal $S_{fld}$ having a low logic value enabling the read operation from the memory 14, generates at the output data terminal O the parallel input test signal $S1_{sci\_p}$ carrying the status of the digital circuit read from the memory 14 and said status is stored into the shift register 18. Afterwards, the state machine 6 generates a low logic value of the second memory enable signal $S_{cnt\_en}$ until the parallel-serial conversion of the input parallel test signal $S1_{sci\_p}$ has been completed, that is in the time interval for emptying the shift register 17 from the data contained in it (that is the status read from the memory 14). Specifically, the state machine 6 generates a low logic value of the second memory enable signal $S_{cnt\_en}$ and the memory 14 receives at the enable terminal CS the memory enable signal $S_{cnt\_en}$ having the low logic value disabling the access to the memory 14; moreover, the state machine 6 generates a high logic value of the read increase signal $S_{dwld}$, the shift register 18 receives the high logic value of the read increase signal $S_{dwld}$ performing the shift of the content of the shift register 18, which generates at the output the data in a serial format. Afterwards, the state machine 6 generates again the high logic value of the memory enable signal $S_{cnt\_en}$ and it is again performed the read from the memory 14 and the storage of the read data into the shift register 18.

It has to be observed that in the first embodiment of the disclosure the state machine 6 performs the comparison of the calculated value of the scan test signature with respect to the expected value of the scan test signature. Alternatively, said comparison can be performed by the controller 3. In this case, the controller 3 receives the expected value by means of one of the programming and control signals $S_{prg\_ctrl}$ received by the state machine 6 (or by means of a signal received from the interface module 5), calculates the value of the scan test signature, performs the comparison of the calculated value of the scan test signature with the expected value and transmits the result of the comparison to the state machine 6 by means of the result and control signals $S_{res\_ctrl}$.

Figure 4:
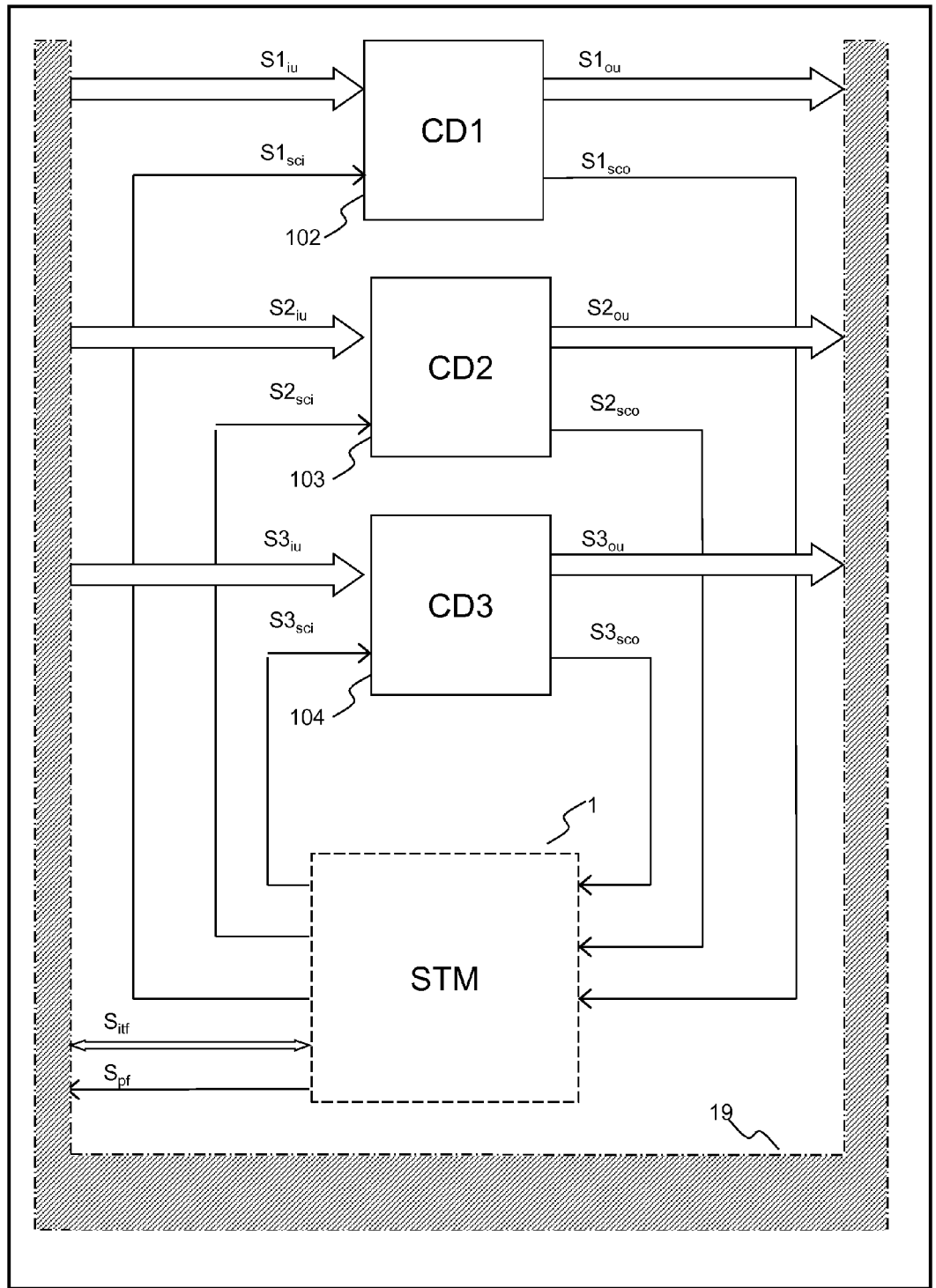
FIG. 4 schematically shows an integrated circuit comprising a system for performing the test of a plurality of digital circuits according to a second embodiment of the disclosure.

With reference to FIG. 4, it is shown an integrated circuit 200 comprising the system 1 for performing the test of a plurality of digital circuits 102, 103, 104 according to a second embodiment of the disclosure. For the sake of simplicity, FIG. 4 shows three digital circuits, but the disclosure can be applied to any number of digital circuits greater than one.

In the second embodiment of the disclosure the execution parameters further comprise a number identifying the specific digital circuit (selected among the three digital circuits 102, 103, 104) on which it is executed the test operation and thus the configuration registers 41 of the interface module 5 further comprise a register indicated as "circuit selection register" for storing the value of the selected digital circuit.

The digital circuit 200 is designed in order to comprise a first portion (corresponding to the application module 19) on which it is not performed the test operation (for example, because it is considered reliable) and a second portion composed of digital circuits on which it is performed the test operation. The second portion is partitioned into a plurality of digital circuits (corresponding in FIG. 4 to the digital circuits 102, 103, 104 of FIG. 4), on which it is performed the test by the test system 1 for verifying faults which can occur during their operation.

The second embodiment of the disclosure has the advantage of allowing to detect faults of different digital circuits which are part of a single integrated circuit (200), without stopping the operation of the whole integrated circuit (200). For example, at a certain time instant $t_{100}$ of the integrated circuit 200 operation the digital circuits 102 and 104 are operating normally, while the digital circuit 103 is inactive: in this time instant $t_{100}$ the test system 1 activates the test operation mode and performs the test of the digital circuit 103, while the other digital circuits 102 and 104 continue to operate normally. At a time instant $t_{101}$ (subsequent to $t_{100}$) the digital circuit 103 goes back to the normal operation mode. Afterwards, at a time instant $t_{102}$ of the integrated circuit 200 operation the digital circuits 102 and 103 are operating normally, while the digital circuit 104 is inactive: in this time instant $t_{102}$ the test system 1 activates the test operation mode and performs the test of the digital circuit 104, while the other digital circuits 102 and 103 continue to operate normally. In this way, it has been executed the test of the operation both of the digital circuit 103 and of the digital circuit 104, without stopping the operation of the whole digital circuit 200.

The operation of the second embodiment of the disclosure is similar to the one of the first embodiment and comprises the following further steps.

In the configuration phase at the time instant $t_2$ the application module 19 transmits to the interface module 5 one of the output interface signals $S_{itf}$ having a value indicating a particular selected digital circuit among the three digital circuits 102, 103, 104 (for example, the selected digital circuit is 103) and said value is stored into the circuit selection register of the interface module 5.

In the configuration phase at the time instant $t_2$ the state machine 6 reads the value of the selected circuit 103 in the circuit selection register of the interface module by means of one of the internal interface signals $S_{itf\_int}$: the following steps of the test will be thus performed on the digital circuit 103. For example, the input test signals $S2_{sci}$ and the output test signals $S2_{sco}$ are used between the test system 1 and the digital circuit 103.

One embodiment of the present disclosure also a method for performing the test of a digital circuit. The method comprises the steps of:

a) generating at least one signal for controlling the storage into a memory of a status of the digital circuit;

b) storing the status of the digital circuit into the memory;

c) executing the test of the digital circuit;

d) generating the at least one signal for controlling the restore into the digital circuit of the status stored into the memory;

e) restoring into the digital circuit the status stored into the memory.

In one embodiment, the step a) comprises the steps of configuring at least one scan chain inside the digital circuit and of generating therefrom the status of the digital circuit over at least one output test signal, and the step b) comprises the reception of the values of the digital circuit status from the at least one scan chain and storing them into the memory, and the step e) comprises the step of:

configuring the at least one scan chain into the digital circuit;

reading from the memory the stored digital circuit status;

transmitting the read status over at least one input test signal;

receiving, at the input of the at least one scan chain, the transmitted status carried over the at least one input test signal;

storing the received status into the at least one scan chain.

In one embodiment, the step b) further comprises the step of calculating a first digital signature from the status of the digital circuit to be stored into the memory, and the step e) further comprises the steps of:

e1) calculating a second digital signature from the status of the digital circuit read from the memory;

e2) comparing the first digital signature value with respect to the second digital signature value;

e3) generating a signal indicating if the first digital signature value is equal to the second digital signature value.

The steps of the method according to the disclosure can be performed by a computer program comprising a software code stored in a computer-readable medium, such as the memory 14 of the memory module 7, and executed in part in the controller 3 and in part in the state machine 6. The controller 3 can be a microprocessor inside the integrated circuit 100 or it can be a logic circuit implemented into the integrated circuit 100; in the first case the programming language used for the code of the software program could be for example C, while in the second case could be VHDL (Very high-speed integrated circuit Hardware Description Language) or Verilog. The state machine 6 is a logic circuit implemented into the integrated circuit 100; the programming language used for the code of the software program can be for example VHDL or Verilog.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a controller, which, in operation, is coupled to a digital circuit and executes a series of tests of the digital circuit;
a memory; and
a state machine, which, in operation:
controls storing of a pre-test status of the digital circuit into the memory, just before the series of tests are executed, wherein the pre-test status is obtained from the digital circuit via one or more scan chains of the digital circuit;
controls sequentially loading a plurality of test patterns into the digital circuit via the one or more scan chains of the digital circuit; and
controls restoring into the digital circuit, after the series of tests are executed and based on the pre-test status stored in the memory, the pre-test status of the digital circuit via the one or more scan chains, wherein, in operation, a respective test pattern of the plurality of test patterns is loaded into the digital circuit before each test of the series of tests.

2. The system according to claim 1, wherein:
the state machine, in operation, controls the restoring by configuring at least one scan chain of the one or more scan chains in the digital circuit, and controls reading from the memory of the stored pre-test status of the digital circuit; and
the memory includes:
at least one input data terminal configured to receive the pre-test status of the digital circuit carried by at least one output test signal generated by the at least one scan chain, and
at least one output data terminal configured to provide at least one input test data signal carrying the pre-test status of the digital circuit read from the memory.

3. A system, comprising:
a controller configured to couple to a digital circuit and execute a test of the digital circuit;
a memory having:
at least one input terminal configured to receive a pre-test status of the digital circuit carried by at least one output test signal generated by at least one scan chain of the digital circuit; and
at least one output data terminal configured to provide at least one input test data signal carrying the pre-test status of the digital circuit read from the memory; and
a state machine configured to:
control storing of the pre-test status of the digital circuit into the memory, just before the test is executed; and
control restoring into the digital circuit, after the test is executed and based on the pre-test status stored in the memory, the pre-test status of the digital circuit, wherein controlling the restoring includes configuring the at least one scan chain in the digital circuit and controlling reading from the memory of the pre-test status of the digital circuit, wherein
the controller is further configured to calculate a scan test digital signature as a function of the at least one output test signal and compare a calculated value of the scan test digital signature to an expected value;
the controller includes:
an output terminal configured to provide a test pattern sequence signal;
an input terminal configured to receive from the digital circuit the at least one output test signal;
a register configured to store a calculated value of the scan test digital signature; and
an output terminal configured to provide a result control signal indicating if the calculated value of the scan test digital signature is equal to the expected value;
the memory module includes:
a first input terminal configured to receive from the at least one scan chain the at least one output test signal;
a second input terminal configured to receive from the controller the test pattern sequence signal;
a multiplexer configured to receive the pre-test status of the digital circuit stored into the memory, receive from the second input terminal the test pattern sequence signal, and generate a multiplexed signal equal to the stored pre-test status of the digital circuit when the state machine is controlling the reading of the stored pre-test status of the digital circuit and equal to the test pattern sequence signal when the controller is executing the test of the digital circuit; and an output terminal configured to transmit to the digital circuit the multiplexed signal over the at least one input test data signal.

4. The system according to claim 3, wherein the controller is further configured to generate the test pattern sequence signal for initializing the at least one scan chain of the digital circuit and the multiplexer is configured to transmit to the digital circuit the multiplexed signal.

5. The system according to claim 1, wherein the state machine, in operation, generates a comparison enable signal, the system including a memory module that includes:
　said memory;
　a first register to store a value of a digital signature calculated from the pre-test status of the digital circuit to be stored into the memory;
　a second register to store a value of a digital signature calculated from the pre-test status of the digital circuit read from the memory; and
　a comparator to compare, in response to being enabled by the comparison enable signal, the first register value with the second register value, generate therefrom a memory test signal, and transmit to the state machine the memory test signal indicating if a value stored in the first register is equal to a value stored in the second register.

6. A system according to claim 5, wherein the state machine, in operation, generates a test result signal indicating that the test of the digital circuit is successful if the memory test signal indicates that the first register value is equal to the second register value.

7. A system according to claim 1, wherein the digital circuit includes a sequential logic circuit to store a value indicative of a status of the digital circuit.

8. An integrated circuit comprising:
　a digital circuit including:
　　at least one output test terminal, which, in operation, selectively provides either:
　　　at least one output test signal carrying a status of the digital circuit; or data calculated according to a logic function implemented by the digital circuit; and
　　at least one input test data terminal;
　an application circuit, which, in operation, generates a signal to activate a series of tests of the digital circuit;
　a controller, which in operation, executes the series of tests of the digital circuit;
　a memory to store the status of the digital circuit; and
　a state machine, which in operation:
　　controls storing into the memory of the status of the digital circuit, before the series of tests are executed, wherein the status of the digital circuit before the series of tests are executed is obtained via the output terminal and one or more scan chains of the digital circuit;
　　controls sequentially loading a plurality of test patterns into the digital circuit via the input terminal and the one or more scan chains of the digital circuit; and
　　controls restoring of the stored status of the digital circuit into the digital circuit via the at least one input test data terminal and the one or more scan chains of the digital circuit after the series of tests are executed, wherein, in operation, a respective test pattern of the plurality of test patterns is loaded into the digital circuit before each test of the series of tests.

9. The integrated circuit according to claim 8, wherein at least one scan chain of the one or more scan chains is coupled between the at least one input test data terminal and the at least one output test terminal, to generate the at least one output test signal carried over the at least one output test terminal.

10. The integrated circuit according to claim 8, wherein:
　the digital circuit is one of a plurality of digital circuits of the integrated circuit;
　the application circuit, in operation, selects one of the plurality of digital circuits;
　the controller executes a series of tests of the digital circuit selected by the application module;
　the memory stores a pre-test status of the selected digital circuit; and
　the state machine controls, before the execution of the series of tests of the selected digital circuit, storing into the memory the pre-test status of the selected digital circuit and, control, after the execution of the series of tests, restoring into the selected digital circuit the pre-test status of the selected digital circuit.

11. A method, comprising:
　generating at least one first signal for controlling storing into a memory of a pre-test status of a digital circuit;
　storing the pre-test status of the digital circuit into the memory, the pre-test status being obtained via one or more scan chains of the digital circuit;
　executing a series of tests of the digital circuit after storing the pre-test status of the digital circuit into the memory, wherein respective test patterns of a plurality of test patterns are sequentially loaded into the digital circuit via the one or more scan chains before each test of the series of tests;
　generating at least one second signal for controlling restoring the pre-test status of the digital circuit stored into the digital circuit; and
　after executing the series of tests of the digital circuit, restoring into the digital circuit, via the one or more scan chains, the pre-test status of the digital circuit stored into the memory.

12. The method according to claim 11, wherein:
　generating the at least one first signal includes configuring at least one scan chain of the one or more scan chains in the digital circuit and generating, using the at least one scan chain, at least one output test signal that includes the pre-test status of the digital circuit,
　storing the pre-test status of the digital circuit includes receiving a value of the digital circuit status from the at least one scan chain and storing the value into the memory, and
　restoring includes the steps of:
　　reading from the memory the stored pre-test status of the digital circuit;
　　transmitting the pre-test status using at least one input test signal;
　　receiving, at the at least one scan chain, the transmitted pre-test status in the at least one input test signal; and
　　storing the received pre-test status into the at least one scan chain.

13. The method according to claim 11, wherein:
　the storing the pre-test status of the digital circuit further includes calculating a first digital signature value from the pre-test status of the digital circuit, and
　the restoring further includes:
　　calculating a second digital signature value from the pre-test status of the digital circuit read from the memory;
　　comparing the first digital signature value with the second digital signature value; and generating a signal indicating if the first digital signature value is equal to the second digital signature value.

14. A non-transitory computer-readable medium comprising instructions configured to cause a processor to implement a method that includes:
generating at least one first signal for controlling storing into a memory of a pre-test status of a digital circuit, the pre-test status being obtained via one or more scan chains of the digital circuit;
storing the pre-test status of the digital circuit into the memory;
executing a series of tests of the digital circuit after storing the pre-test status of the digital circuit into the memory, wherein executing the series of tests includes sequentially loading, via the one or more scan chains of the digital circuit, respective test patterns of a plurality of test patterns into the digital circuit before each test of the series of tests;
generating at least one second signal for controlling restoring into the digital circuit of the pre-test status stored into the memory; and
after executing the series of tests of the digital circuit, reading the pre-test status stored into the memory from the memory and restoring the status read from the memory into the digital circuit via the one or more scan chains.

15. The non-transitory computer-readable medium according to claim 14, wherein:
generating the at least one first signal includes configuring at least one scan chain of the one or more scan chains and generating, using the at least one scan chain, at least one output test signal that includes the pre-test status of the digital circuit,
storing the pre-test status includes receiving a value of the pre-test status of the digital circuit from the at least one scan chain and storing the value into the memory, and
restoring includes the steps of:
transmitting the pre-test status using at least one input test signal;
receiving, at the at least one scan chain, the transmitted pre-test status in the at least one input test signal; and
storing the received pre-test status into the at least one scan chain.

16. The non-transitory computer-readable medium according to claim 14, wherein:
the storing the pre-test status of the digital circuit further includes calculating a first digital signature value from the pre-test status of the digital circuit, and
the restoring further includes:
calculating a second digital signature value from the status of the digital circuit read from the memory;
comparing the first digital signature value with the second digital signature value; and
generating a signal indicating if the first digital signature value is equal to the second digital signature value.

17. The non-transitory computer-readable medium of claim 14 wherein the method includes generating control signals to control a multiplexer to:
output a test signal during execution of the test of the digital circuit; and
output the stored status of the digital circuit when restoring into the digital circuit the status stored into the memory.

18. The system of claim 1, comprising:
a multiplexer configured to:
receive test pattern sequences;
receive the stored status of the digital circuit;
sequentially output the received test pattern sequences when the controller is executing the test of the digital circuit; and
output the received stored status of the digital circuit when the state machine is controlling the restoring into the digital circuit of the status of the digital circuit stored into the memory.

19. The integrated circuit of claim 8, comprising:
a multiplexer configured to:
receive a test signal;
receive the stored status of the digital circuit;
output the received test signal when the controller is executing the test of the digital circuit; and
output the received stored status of the digital circuit when the state machine is controlling the restoring into the digital circuit of the status of the digital circuit stored into the memory.

20. The method of claim 11, comprising:
generating control signals to control a multiplexer to:
output a test signal during execution of the test of the digital circuit; and
output the stored status of the digital circuit when restoring into the digital circuit the status of the digital circuit stored into the memory.

21. A system, comprising:
one or more nodes to couple to a memory;
one or more nodes to couple to a digital circuit;
a controller, which, in operation, controls execution of a series of digital circuit tests; and
a state machine, which, in operation, controls:
storing a pre-test status of the digital circuit in the memory, the pre-test status being received via at least one scan chain of the digital circuit; and
restoring, after execution of the series of digital circuit tests and via the at least one scan chain, of the pre-test status of the digital circuit based on the pre-test status of the digital circuit stored in the memory, wherein, in operation, respective test patterns of a plurality of test patterns are sequentially loaded, via the at least one scan chain, into the digital circuit during execution of the series of tests.

22. The system of claim 21, comprising:
the memory.

23. The system of claim 22, comprising:
the digital circuit.

24. The system of claim 21, comprising:
a multiplexer configured to:
receive a test signal;
receive the pre-test status of the digital circuit stored in the memory;
output the received test signal when a test of the digital circuit is being executed; and
output the received pre-test status of the digital circuit stored in the memory when the state machine is controlling the restoring of the status of the digital circuit.

25. The system of claim 21 wherein the controller, in operation, controls testing of the digital circuit which modifies one or more values of components of the digital circuit.

26. The system of claim 21 wherein the controller comprises:
an output terminal to provide a test pattern sequence signal;
an input terminal to receive from the digital circuit at least one output test signal;
a register to store a calculated value of a scan test digital signature; and
an output terminal to provide a result control signal based on the scan test digital signal and an expected value.

27. The system of claim 1 wherein the controller, in operation, executes testing which modifies values of one or more components of the digital circuit.

28. The system of claim 27 wherein the one or more components of the digital circuit include one or more of a register and a flip-flop used for implementing a logic function of the digital circuit.

29. The method of claim 11 wherein the executing the series of tests of the digital circuit comprises at least one of modifying a value of a register and modifying a value of a flip-flop of the digital circuit.

30. The system of claim 2 wherein the controller, in operation, calculates a scan test digital signature as a function of the at least one output test signal and compares a calculated value of the scan test digital signature to an expected value;
    the controller includes:
        an output terminal to provide a test pattern sequence signal;
        an input terminal to receive from the digital circuit the at least one output test signal;
        a register to store a calculated value of the scan test digital signature; and
        an output terminal to provide a result control signal indicating if the calculated value of the scan test digital signature is equal to the expected value; and
    the memory module includes:
        a first input terminal to receive from the at least one scan chain the at least one output test signal;
        a second input terminal to receive from the controller the test pattern sequence signal;
        a multiplexer to receive the pre-test status of the digital circuit stored into the memory, receive from the second input terminal the test pattern sequence signal, and generate a multiplexed signal equal to the stored pre-test status of the digital circuit when the state machine is controlling the reading of the stored pre-test status of the digital circuit and equal to the test pattern sequence signal when the controller is executing the test of the digital circuit; and
        an output terminal to transmit to the digital circuit the multiplexed signal over the at least one input test data signal.

\* \* \* \* \*